(12) United States Patent
Gower et al.

(10) Patent No.: US 7,539,810 B2
(45) Date of Patent: *May 26, 2009

(54) SYSTEM, METHOD AND STORAGE MEDIUM FOR A MULTI-MODE MEMORY BUFFER DEVICE

(75) Inventors: Kevin C. Gower, LaGrangeville, NY (US); Mark W. Kellogg, Henrietta, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/029,641

(22) Filed: Feb. 12, 2008

(65) Prior Publication Data

US 2008/0133797 A1    Jun. 5, 2008

Related U.S. Application Data

(63) Continuation of application No. 10/903,366, filed on Jul. 30, 2004, now Pat. No. 7,389,375.

(51) Int. Cl.
*G06F 13/36* (2006.01)
(52) U.S. Cl. .................................... 710/310
(58) Field of Classification Search .................. 710/310
See application file for complete search history.

(56) References Cited

U.S. PATENT DOCUMENTS

| | | | |
|---|---|---|---|
| 2,842,682 A | 7/1958 | Clapper | |
| 3,333,253 A | 7/1967 | Sahulka | |
| 3,395,400 A | 7/1968 | De Witt et al. | |
| 3,825,904 A | 7/1974 | Burk et al. | 340/172.5 |
| 4,028,675 A | 6/1977 | Frankenberg | 711/106 |
| 4,135,240 A | 1/1979 | Ritchie | |
| 4,472,780 A | 9/1984 | Chenoweth et al. | |
| 4,475,194 A | 10/1984 | LaVallee et al. | 371/10 |
| 4,486,739 A | 12/1984 | Franaszek et al. | 340/347 |
| 4,641,263 A | 2/1987 | Perlman et al. | |
| 4,654,857 A | 3/1987 | Samson et al. | 371/68 |
| 4,723,120 A | 2/1988 | Petty, Jr. | |
| 4,740,916 A | 4/1988 | Martin | 364/900 |

(Continued)

FOREIGN PATENT DOCUMENTS

EP    0229316 A2    7/1987

(Continued)

OTHER PUBLICATIONS

Benini, et al., "System-Level Powers Optimization: Techniques and Tools", ACM Transactions on Design Automation of Electronic Systems, vol. 5, No. 2, Apr. 2000, pp. 115-192.

(Continued)

*Primary Examiner*—Paul R Myers
(74) *Attorney, Agent, or Firm*—Cantor Colburn LLP; Lynn Augspurger

(57) ABSTRACT

A multi-mode memory buffer device for use in various memory subsystem structures. The buffer device includes a packetized multi-transfer interface which is redriven to permit connection between a first memory assembly and cascaded memory assemblies. The buffer device also includes a memory interface adapted to connect to either a second memory assembly or directly to memory devices.

20 Claims, 13 Drawing Sheets

U.S. PATENT DOCUMENTS

| | | | |
|---|---|---|---|
| 4,796,231 A | 1/1989 | Pinkham | 365/189.05 |
| 4,803,485 A | 2/1989 | Rypinkski | 370/452 |
| 4,833,605 A | 5/1989 | Terada et al. | 364/200 |
| 4,839,534 A | 6/1989 | Clasen | 307/269 |
| 4,943,984 A | 7/1990 | Pechanek et al. | 375/109 |
| 4,985,828 A | 1/1991 | Shimizu et al. | 364/200 |
| 5,053,947 A | 10/1991 | Heibel et al. | 364/200 |
| 5,177,375 A | 1/1993 | Ogawa et al. | |
| 5,206,946 A | 4/1993 | Brunk | 710/2 |
| 5,214,747 A | 5/1993 | Cok | 395/27 |
| 5,265,212 A | 11/1993 | Bruce, II | 710/113 |
| 5,287,531 A | 2/1994 | Rogers, Jr. et al. | 395/800 |
| 5,347,270 A | 9/1994 | Matsuda et al. | 340/2.21 |
| 5,357,621 A | 10/1994 | Cox | |
| 5,375,127 A | 12/1994 | Leak et al. | |
| 5,387,911 A | 2/1995 | Gleichert et al. | 341/95 |
| 5,394,535 A | 2/1995 | Ohuchi | 711/155 |
| 5,454,091 A | 9/1995 | Sites et al. | 395/413 |
| 5,475,690 A | 12/1995 | Burns et al. | 370/105.3 |
| 5,513,135 A | 4/1996 | Dell et al. | |
| 5,517,626 A | 5/1996 | Archer et al. | |
| 5,522,064 A | 5/1996 | Aldereguia et al. | |
| 5,544,309 A | 8/1996 | Chang et al. | 395/183.06 |
| 5,546,023 A | 8/1996 | Borkar et al. | |
| 5,561,826 A | 10/1996 | Davies et al. | |
| 5,592,632 A | 1/1997 | Leung et al. | 395/306 |
| 5,594,925 A | 1/1997 | Harder et al. | |
| 5,611,055 A | 3/1997 | Krishan et al. | 395/281 |
| 5,613,077 A | 3/1997 | Leung et al. | 395/306 |
| 5,627,963 A | 5/1997 | Gabillard et al. | 714/42 |
| 5,629,685 A | 5/1997 | Allen et al. | 340/825.02 |
| 5,661,677 A | 8/1997 | Rondeau, II et al. | 365/63 |
| 5,666,480 A | 9/1997 | Leung et al. | 395/180 |
| 5,684,418 A | 11/1997 | Yanagiuchi | |
| 5,706,346 A | 1/1998 | Katta et al. | |
| 5,754,804 A | 5/1998 | Cheselka et al. | |
| 5,764,155 A | 6/1998 | Kertesz et al. | 340/825.08 |
| 5,822,749 A | 10/1998 | Agarwal | 707/2 |
| 5,852,617 A | 12/1998 | Mote, Jr. | 714/726 |
| 5,870,325 A | 2/1999 | Nielsen et al. | 365/63 |
| 5,872,996 A | 2/1999 | Barth et al. | 395/853 |
| 5,917,760 A | 6/1999 | Millar | |
| 5,926,838 A | 7/1999 | Jeddeloh | 711/167 |
| 5,928,343 A | 7/1999 | Farmwald et al. | 710/104 |
| 5,930,273 A | 7/1999 | Mukojima | 714/776 |
| 5,959,914 A | 9/1999 | Gates et al. | |
| 5,973,951 A | 10/1999 | Bechtolsheim et al. | 365/52 |
| 5,974,493 A | 10/1999 | Okumura et al. | 710/307 |
| 5,995,405 A | 11/1999 | Trick | 365/63 |
| 6,003,121 A | 12/1999 | Wirt | |
| 6,011,732 A | 1/2000 | Harrison et al. | |
| 6,038,132 A | 3/2000 | Tokunaga et al. | 361/760 |
| 6,049,476 A | 4/2000 | Laudon et al. | 365/52 |
| 6,076,158 A | 6/2000 | Sites et al. | 712/230 |
| 6,078,515 A | 6/2000 | Nielsen et al. | 365/63 |
| 6,081,868 A | 6/2000 | Brooks | |
| 6,085,276 A | 7/2000 | VanDoren et al. | |
| 6,096,091 A | 8/2000 | Hartmann | 716/17 |
| 6,128,746 A | 10/2000 | Clark et al. | 713/324 |
| 6,145,028 A | 11/2000 | Shank et al. | |
| 6,170,047 B1 | 1/2001 | Dye | 711/170 |
| 6,170,059 B1 | 1/2001 | Pruett et al. | 713/200 |
| 6,173,382 B1 | 1/2001 | Dell et al. | 711/170 |
| 6,185,718 B1 | 2/2001 | Dell et al. | |
| 6,215,686 B1 | 4/2001 | Deneroff et al. | 365/52 |
| 6,219,288 B1 | 4/2001 | Braceras et al. | |
| 6,219,760 B1 | 4/2001 | McMinn | |
| 6,233,639 B1 | 5/2001 | Dell et al. | |
| 6,260,127 B1 | 7/2001 | Olarig et al. | 711/167 |
| 6,262,493 B1 | 7/2001 | Garnett | |
| 6,292,903 B1 | 9/2001 | Coteus et al. | 713/401 |
| 6,301,636 B1 | 10/2001 | Schultz et al. | 711/108 |
| 6,308,247 B1 | 10/2001 | Ackerman et al. | |
| 6,317,352 B1 | 11/2001 | Halbert et al. | 365/52 |
| 6,321,343 B1 | 11/2001 | Toda | 713/600 |
| 6,338,113 B1 | 1/2002 | Kubo et al. | 711/105 |
| 6,349,390 B1 | 2/2002 | Dell et al. | |
| 6,357,018 B1 | 3/2002 | Stuewe et al. | |
| 6,370,631 B1 | 4/2002 | Dye | 711/170 |
| 6,378,018 B1 | 4/2002 | Tsern et al. | 710/129 |
| 6,381,685 B2 | 4/2002 | Dell et al. | |
| 6,393,528 B1 | 5/2002 | Arimilli et al. | 711/137 |
| 6,408,398 B1 | 6/2002 | Freker et al. | |
| 6,442,698 B2 | 8/2002 | Nizar | |
| 6,446,174 B1 | 9/2002 | Dow | |
| 6,467,013 B1 | 10/2002 | Nizar | |
| 6,473,836 B1 | 10/2002 | Ikeda | 711/137 |
| 6,477,614 B1 | 11/2002 | Leddige et al. | |
| 6,483,755 B2 | 11/2002 | Leung et al. | 365/189.05 |
| 6,484,271 B1 | 11/2002 | Gray | |
| 6,487,102 B1 | 11/2002 | Halbert et al. | |
| 6,487,627 B1 | 11/2002 | Willke et al. | 710/306 |
| 6,493,250 B2 | 12/2002 | Halbert et al. | 365/63 |
| 6,496,540 B1 | 12/2002 | Widmer | 375/242 |
| 6,496,910 B1 | 12/2002 | Baentsch et al. | 711/165 |
| 6,499,070 B1 | 12/2002 | Whetsel | 710/71 |
| 6,502,161 B1 | 12/2002 | Perego et al. | 711/5 |
| 6,507,888 B2 | 1/2003 | Wu et al. | 711/105 |
| 6,510,100 B2 | 1/2003 | Grundon et al. | 365/233 |
| 6,513,091 B1 | 1/2003 | Blackmon et al. | 710/316 |
| 6,530,007 B2 | 3/2003 | Olarig | |
| 6,532,525 B1 | 3/2003 | Aleksic et al. | 711/168 |
| 6,546,359 B1 | 4/2003 | Week | 702/186 |
| 6,549,971 B1 | 4/2003 | Cecchi et al. | 710/306 |
| 6,553,450 B1 | 4/2003 | Dodd et al. | 711/105 |
| 6,557,069 B1 | 4/2003 | Drehmel et al. | 710/307 |
| 6,564,329 B1 | 5/2003 | Cheung et al. | 713/322 |
| 6,584,576 B1 | 6/2003 | Co | |
| 6,587,912 B2 | 7/2003 | Leddige et al. | |
| 6,590,827 B2 | 7/2003 | Chang et al. | |
| 6,594,748 B1 | 7/2003 | Lin | |
| 6,601,121 B2 | 7/2003 | Singh et al. | 710/112 |
| 6,601,149 B1 | 7/2003 | Brock et al. | |
| 6,604,180 B2 | 8/2003 | Jeddeloh | |
| 6,611,905 B1 | 8/2003 | Grundon et al. | 711/167 |
| 6,622,217 B2 | 9/2003 | Gharacorloo et al. | 711/141 |
| 6,625,687 B1 | 9/2003 | Halber et al. | 711/105 |
| 6,625,702 B2 | 9/2003 | Rentscler et al. | |
| 6,628,538 B2 | 9/2003 | Funaba et al. | 365/63 |
| 6,631,439 B2 | 10/2003 | Saulsbury et al. | |
| 6,671,376 B1 | 12/2003 | Koto et al. | 380/210 |
| 6,678,811 B2 | 1/2004 | Rentscler et al. | 711/167 |
| 6,684,320 B2 | 1/2004 | Mohamed et al. | |
| 6,697,919 B2 | 2/2004 | Gharacorloo et al. | 711/141 |
| 6,704,842 B1 | 3/2004 | Janakiraman et al. | |
| 6,721,185 B2 | 4/2004 | Dong et al. | |
| 6,721,944 B2 | 4/2004 | Chaudhry et al. | |
| 6,738,836 B1 | 5/2004 | Kessler et al. | |
| 6,741,096 B2 | 5/2004 | Moss | |
| 6,748,518 B1 | 6/2004 | Guthrie et al. | |
| 6,754,762 B1 | 6/2004 | Curley | |
| 6,766,389 B2 | 7/2004 | Hayter et al. | |
| 6,775,747 B2 | 8/2004 | Venkatraman | |
| 6,779,075 B2 | 8/2004 | Wu et al. | 711/105 |
| 6,791,555 B1 | 9/2004 | Radke et al. | |
| 6,792,495 B1 | 9/2004 | Garney et al. | |
| 6,807,650 B2 | 10/2004 | Lamb et al. | 716/1 |
| 6,832,286 B2 | 12/2004 | Johnson et al. | 711/105 |
| 6,834,355 B2 | 12/2004 | Uzelac | 713/300 |
| 6,839,393 B1 | 1/2005 | Sidiropoulos | 375/371 |
| 6,854,043 B2 | 2/2005 | Hargis et al. | 711/168 |
| 6,865,646 B2 | 3/2005 | David | 711/128 |
| 6,871,253 B2 | 3/2005 | Greeff et al. | 710/316 |
| 6,874,102 B2 | 3/2005 | Doody et al. | 714/5 |

| | | |
|---|---|---|
| 6,877,076 B1 | 4/2005 | Cho et al. |
| 6,877,078 B2 | 4/2005 | Fujiwara et al. |
| 6,882,082 B2 | 4/2005 | Greeff et al. |
| 6,889,284 B1 | 5/2005 | Nizar et al. |
| 6,898,726 B1 | 5/2005 | Lee |
| 6,918,068 B2 | 7/2005 | Vail et al. |
| 6,938,119 B2 | 8/2005 | Kohn et al. |
| 6,944,084 B2 | 9/2005 | Wilcox |
| 6,948,091 B2 | 9/2005 | Bartels et al. |
| 6,949,950 B2 | 9/2005 | Takahashi et al. |
| 6,977,536 B2 | 12/2005 | Chin-Chieh et al. ......... 327/116 |
| 6,993,612 B2 | 1/2006 | Porterfield |
| 7,024,518 B2 | 4/2006 | Halbert et al. ............... 711/115 |
| 7,039,755 B1 | 5/2006 | Helms |
| 7,047,384 B2 | 5/2006 | Bodas et al. |
| 7,051,172 B2 | 5/2006 | Mastronarde et al. ....... 711/158 |
| 7,073,010 B2 | 7/2006 | Chen et al. .................. 710/313 |
| 7,076,700 B2 | 7/2006 | Rieger |
| 7,093,078 B2 | 8/2006 | Kondo ......................... 711/141 |
| 7,096,407 B2 | 8/2006 | Olarig ......................... 714/768 |
| 7,103,792 B2 | 9/2006 | Moon |
| 7,113,418 B2 | 9/2006 | Oberlin et al. ................. 365/63 |
| 7,114,109 B2 | 9/2006 | Daily et al. .................. 714/724 |
| 7,127,629 B2 | 10/2006 | Vogt ............................ 713/500 |
| 7,133,790 B2 | 11/2006 | Liou |
| 7,133,972 B2 | 11/2006 | Jeddeloh |
| 7,136,958 B2 | 11/2006 | Jeddeloh ..................... 710/317 |
| 7,155,623 B2 | 12/2006 | Lefurgy et al. .............. 713/300 |
| 7,162,567 B2 | 1/2007 | Jeddeloh et al. ............. 711/154 |
| 7,165,153 B2 | 1/2007 | Vogt ............................ 711/154 |
| 7,177,211 B2 | 2/2007 | Zimmerman ................ 365/201 |
| 7,181,584 B2 | 2/2007 | LeBerge ...................... 711/167 |
| 7,194,593 B2 | 3/2007 | Schnepper |
| 7,197,594 B2 | 3/2007 | Raz et al. |
| 7,200,832 B2 | 4/2007 | Butt et al. ..................... 710/17 |
| 7,206,962 B2 | 4/2007 | Deegan |
| 7,216,196 B2 | 5/2007 | Jeddeloh |
| 7,227,949 B2 | 6/2007 | Heegard et al. |
| 7,234,099 B2 | 6/2007 | Gower et al. ................ 714/767 |
| 7,240,145 B2 | 7/2007 | Holman |
| 7,260,685 B2 | 8/2007 | Lee et al. .................... 711/213 |
| 7,266,634 B2 | 9/2007 | Ware et al. |
| 7,313,583 B2 | 12/2007 | Porten et al. |
| 7,321,979 B2 | 1/2008 | Lee |
| 2001/0029566 A1 | 10/2001 | Woo |
| 2002/0019926 A1 | 2/2002 | Huppenthal et al. ........... 712/15 |
| 2002/0059439 A1 | 5/2002 | Arroyo et al. |
| 2002/0103988 A1 | 8/2002 | Dornier ........................ 712/38 |
| 2003/0009632 A1 | 1/2003 | Arimilli et al. |
| 2003/0028701 A1 | 2/2003 | Rao et al. |
| 2003/0033364 A1 | 2/2003 | Garnett et al. .............. 709/203 |
| 2003/0051055 A1 | 3/2003 | Parrella et al. |
| 2003/0056183 A1 | 3/2003 | Kobayashi |
| 2003/0084309 A1 | 5/2003 | Kohn .......................... 713/189 |
| 2003/0090879 A1 | 5/2003 | Doblar et al. ............... 361/728 |
| 2003/0105938 A1 | 6/2003 | Cooksey et al. |
| 2004/0049723 A1 | 3/2004 | Obara ......................... 714/729 |
| 2004/0098549 A1 | 5/2004 | Dorst |
| 2004/0117588 A1 | 6/2004 | Arimilli et al. .............. 711/203 |
| 2004/0123222 A1 | 6/2004 | Widmer |
| 2004/0128474 A1 | 7/2004 | Vorbach ....................... 712/10 |
| 2004/0148482 A1 | 7/2004 | Grundy et al. |
| 2004/0165609 A1 | 8/2004 | Herbst et al. |
| 2004/0199363 A1 | 10/2004 | Bohizic et al. |
| 2004/0230718 A1 | 11/2004 | Polzin et al. .................. 710/22 |
| 2004/0260909 A1 | 12/2004 | Lee et al. |
| 2004/0260957 A1 | 12/2004 | Jeddeloh et al. |
| 2005/0023560 A1 | 2/2005 | Ahn et al. .................... 257/200 |
| 2005/0044305 A1 | 2/2005 | Jakobs et al. |
| 2005/0050237 A1 | 3/2005 | Jeddeloh et al. ............... 710/10 |
| 2005/0071542 A1 | 3/2005 | Weber et al. |
| 2005/0080581 A1 | 4/2005 | Zimmerman et al. ........ 702/117 |
| 2005/0081129 A1 | 4/2005 | Shah et al. |
| 2005/0086441 A1 | 4/2005 | Meyer et al. |
| 2005/0125702 A1 | 6/2005 | Huang et al. |
| 2005/0125703 A1 | 6/2005 | Lefurgy et al. |
| 2005/0138246 A1 | 6/2005 | Chen et al. |
| 2005/0138267 A1 | 6/2005 | Bains et al. .................. 711/100 |
| 2005/0144399 A1 | 6/2005 | Hosomi ....................... 711/145 |
| 2005/0149665 A1 | 7/2005 | Wolrich et al. |
| 2005/0166006 A1 | 7/2005 | Talbot et al. |
| 2005/0177677 A1 | 8/2005 | Jeddeloh |
| 2005/0216678 A1 | 9/2005 | Jeddeloh |
| 2005/0223196 A1 | 10/2005 | Knowles |
| 2005/0248997 A1 | 11/2005 | Lee |
| 2005/0259496 A1 | 11/2005 | Hsu et al. .................... 365/226 |
| 2005/0289377 A1 | 12/2005 | Luong et al. |
| 2006/0036826 A1 | 2/2006 | Dell et al. |
| 2006/0036827 A1 | 2/2006 | Dell et al. |
| 2006/0080584 A1 | 4/2006 | Hartnett et al. |
| 2006/0085602 A1 | 4/2006 | Huggahalli et al. |
| 2006/0095592 A1 | 5/2006 | Borkenhagen |
| 2006/0095679 A1 | 5/2006 | Edirisooriya |
| 2006/0107175 A1 | 5/2006 | Dell et al. |
| 2006/0112238 A1 | 5/2006 | Jamil et al. |
| 2006/0161733 A1 | 7/2006 | Beckett et al. |
| 2006/0195631 A1 | 8/2006 | Rajamani |
| 2006/0288172 A1 | 12/2006 | Lee et al. |
| 2007/0025304 A1 | 2/2007 | Leelahakriengkrai et al. |
| 2007/0160053 A1 | 7/2007 | Coteus et al. |

FOREIGN PATENT DOCUMENTS

| | | |
|---|---|---|
| EP | 0470734 A1 | 2/1992 |
| EP | 1429340 A2 | 6/2004 |
| GB | 2396711 A | 6/2004 |
| JP | 59153353 | 9/1984 |
| JP | 0432614 | 11/1992 |
| JP | 10011971 | 1/1998 |
| WO | 9621188 | 7/1996 |
| WO | 00/04481 A | 1/2000 |
| WO | 0223353 A2 | 3/2002 |
| WO | 2005/038660 A | 4/2005 |

OTHER PUBLICATIONS

Boudon, et al., "Novel Bus Reconfiguration Scheme With Spare Lines", IBM Technical Disclosure Bulletin, May 1987, vol. 29, No. 12, pp. 1-3.

Brown, et al "Compiler-Based I/O Prefetching for Out-of-Core Applications", ACM Transactions on Computer Systems, vol. 19, No. 2, May 2001, pp. 111-170.

Ghoneima et al.; "Optimum Positioning of Interleaved Repeaters in Bidirectional Buses;" IEEE Transactions on Computer-Aided Design of Integrated Circuits and Systems, vol. 25, No. 3, Mar. 2005, pp. 461-469.

IEEE, "IEEE Standard Test Access Port and Boundary-Scan Architecture", Jul. 23, 2001, IEEE Std 1149-1-2001, pp. 11-13.

JEDEC Solid State Technology Association, "JEDEC Standard: DDR2 SDRAM Specification", Jan. 2004, JEDEC, Revision JESD79-2A, p. 10.

Jungjoon Kim et al.; "Performance and Architecture Features of Segmented Multiple Bus System;" IEEE Computer Society; Sep. 21-24, 1999 International Conference on Parallel Processing (ICPP'99).

Massoud Pedram, "Power Minimization in IC Design Principles and Applications", ACM Transactions on Design Automation of Electronic Systems vol. 1, No. 1, Jan. 1996, pp. 3-56.

Natarajan, et al., "A Study of Performance Impact of Memory Controller Features in Multi-Processor Server Environment", Jun. 2004, pp. 80-87.

NB940259 (IBM Technical Disclosure Bulletin, Feb. 1994; vol. 37; pp. 59-64).

Nilsen, "High-Level Dynamic Memory Management for Object-Oriented Real-Time Systems", Jan. 1, 1996, pp. 86-93.

P.R. Panda, "Data and Memory Optimization Techniques For Embedded Systems", ACM Transactions on Design Automation of Electronic Systems, vol. 6, No. 2, Apr. 2001, pp. 149-206.

Penrod, Lee, "Understanding System Memory and CPU Speeds: A laymans guide to the Front Side Bus (FSB)", Dec. 28, 2005, Direction . Org, pp. 1-5, http://www.directron.com/directron/fsbguide.html. [online]; [retrieved on Feb. 23, 2006]; retrieved from the Internet.

Rosenberg, "Dictionary of Computers, Information Processing & Telecommunications", Second Edition, John Wiley & Sons, Inc. 1987, 3 pgs.

Seceleanu et al.; "Segment Arbiter as Action System;" IEEE Jul. 2003 pp. 249-252.

Singh, S., et al., "Bus Sparing for Fault-Tolerant System Design", IBM Technical Disclosure Bulletin, Dec. 1991, vol. 34, No. 71, pp. 117-118.

Siverncrona et al.; "RedCAN™: Simulations of two Fault Recovery Algorithms for CAN;" Proceedings for the 10th IEEE Pacific Rim International Symposium on Dependable Computing (PRDC'04); Mar. 3-5, 2005.

U.S. Appl. No. 11/419,586, filed May 22, 2006. Robert Tremaine. "Systems and Methods for Providing Remote Pre-Fetch Buffers".

Wang, et al., "Guided Region Prefetching: A Cooperative Hardware/Software Approach", Jun. 2003, pp. 388-398.

Wikipedia, Serial Communications, [online], [retrieved Apr. 10, 2007 from the Internet], http://en.wikipedia.org/wiki/Serial_communications,p. 1.

International Search Report, International Application No. PCT/EP2007/054929, International Publication No. WO 2007/135144 A1, received Mar. 21, 2008.

Joe Jeddeloh, Fully Buffered DIMM (FB-DIMM), XP002490174, Advanced Systems Technology, Micron Technology, Inc. Apr. 16, 2008, 23 pages.

Timothy J. Dell, "The RAS Implications of DIMM Connector Failure Rates in Large, Highly Available Server Systems", The 53rd IEEE Holm Conference on Electrical Contacts, IEEE, Sep. 16-19, 2007, pp. 256-261.

"Using Dual and Mappable Spare Bus", XP000433763, IBM Technical Disclosure Bulletin, vol. 37, No. 2B, IBM Copr., NY, US, Feb. 1, 1994, pp. 59-63.

"Novel Bus Reconfiguration Scheme With Spare Lines", XP000676205, IBM Technical Disclosure Bulletin, vol. 29, No. 12, IBM Copr., NY, US, May 12, 1987, pp. 5590-5593.

European Search Report, European Patent Application 05106700.7, received Aug. 11, 2008.

PCT Search Report PCT/EP2006/068984. Mailed Feb. 9, 2007.

PCT Search Report PCT/EP2007/057915. Mailed Jul. 31, 2007.

PCT Search Report PCT/EP2007/057916. Mailed Dec. 14, 2007.

International Search Report, International Patent Application No. PCT/US047/75944, mailed Sep. 23, 2008, 3 pages.

European Search Report, European Patent Application No. 05106701.5, mailed Oct. 7, 2008, 5 pages.

European Search Report, European Patent Application No. 05109837, mailed Oct. 7, 2008, 5 pages.

TYPICAL LARGE-SYSTEM MEMORY CONFIGURATION

| | Buffer Mode | # Memory Ranks per DIMM | # of Buffer CS Outputs Used / Loads per CS | # Buffer Clock Pairs Used / Loads per Clock Pair | Misc |
|---|---|---|---|---|---|
| 1202 | Buffer DIMM | 1 | 2 / 4-5 Loads | 2 / 4-5 Loads | 'Fly-by' topology |
| | | 2 | 4 / 4-5 Loads | 4 / 4-5 Loads | 'Fly-by' topology |
| | | 4 | 8 / 4-5 Loads | 6 / 6 Loads | 'Fly-by' topology |
| | | 8 | 8 / 9 Loads | 6 / 12 Loads | 'Fly-by' / "T" topology |
| 1204 | Registered DIMM | 1 | 2 / 1 or 2 Loads | 2 / 1 or 2 Loads | Inputs wire to register or PLL (Clock) Direct connect or point to point |
| | | 2 | 4 / 1 or 2 Loads | 4 / 1 or 2 Loads | Inputs wire to register or PLL (Clock) Direct connect or point to point |
| 1206 | Unbuffered DIMM | 1 | 2 / 4-9 Loads | 6 / 1-3 Loads | 'T' net topology |
| | | 2 | 2 / 8-18 Loads | 6 / 2-6 Loads | 'T' net topology |

FIG. 12

SYSTEM, METHOD AND STORAGE MEDIUM FOR A MULTI-MODE MEMORY BUFFER DEVICE

CROSS REFERENCE TO RELATED APPLICATION

This application is a continuation application of U.S. Ser. No. 10/903,366 filed Jul. 30, 2004 now U.S. Pat. No. 7,389,375, the contents of which are incorporated by reference herein in their entirety.

BACKGROUND OF THE INVENTION

The invention relates to memory subsystems and in particular, to a buffered memory module interface device with multiple operating modes.

Computer memory subsystems have evolved over the years, but continue to retain many consistent attributes. Computer memory subsystems from the early 1980's, such as the one disclosed in U.S. Pat. No. 4,475,194 to LeVellee et al, of common assignment herewith, included a memory controller, a memory assembly (contemporarily called a basic storage module (BSM) by the inventors) with array devices, buffers, terminators and ancillary timing and control functions, as well as several point-to-point busses to permit each memory assembly to communicate with the memory controller via its own point-to-point address and data bus. FIG. 1 depicts an example of this early 1980 computer memory subsystem with two BSMs, a memory controller, a maintenance console, and point-to-point address and data busses connecting the BSMs and the memory controller.

FIG. 2, from U.S. Pat. No. 5,513,135 to Dell et al, of common assignment herewith, depicts an early synchronous memory module, which includes synchronous dynamic random access memories (DRAMs) 8, buffer devices 12, an optimized pinout, an interconnect and a capacitive decoupling method to facilitate operation. The patent also describes the use of clock re-drive on the module, using such devices as phase lock loops (PLLs).

FIG. 3, from U.S. Pat. No. 6,510,100 to Grundon et al, of common assignment herewith, depicts a simplified diagram and description of a memory subsystem 10 that includes up to four registered dual inline memory modules (DIMMs) 40 on a traditional multi-drop stub bus channel. The subsystem includes a memory controller 20, an external clock buffer 30, registered DIMMs 40, address bus 50, control bus 60 and a data bus 70 with terminators 95 on the address bus 50 and data bus 70.

FIG. 4 depicts a 1990's memory subsystem which evolved from the structure in FIG. 1 and included a memory controller 402, one or more high speed point-to-point channels 404, each connected to a bus-to-bus converter chip 406, and each having a synchronous memory interface 408 that enables connection to one or more registered DIMMs 410. In this implementation, the high speed, point-to-point channel 404 operated at twice the DRAM data rate, allowing the bus-to-bus converter chip 406 to operate one or two registered DIMM memory channels at the full DRAM data rate. Each registered DIMM included a PLL, registers, DRAMs, an electrically erasable programmable read-only memory (EE-PROM) and terminators, in addition to other passive components.

As shown in FIG. 5, memory subsystems were often constructed with a memory controller connected either to a single memory module, or to two or more memory modules interconnected on a 'stub' bus. FIG. 5 is a simplified example of a multi-drop stub bus memory structure, similar to the one shown in FIG. 3. This structure offers a reasonable tradeoff between cost, performance, reliability and upgrade capability, but has inherent limits on the number of modules that may be attached to the stub bus. The limit on the number of modules that may be attached to the stub bus is directly related to the data rate of the information transferred over the bus. As data rates increase, the number and length of the stubs must be reduced to ensure robust memory operation. Increasing the speed of the bus generally results in a reduction in modules on the bus, with the optimal electrical interface being one in which a single module is directly connected to a single controller, or a point-to-point interface with few, if any, stubs that will result in reflections and impedance discontinuities. As most memory modules are sixty-four or seventy-two bits in data width, this structure also requires a large number of pins to transfer address, command, and data. One hundred and twenty pins are identified in FIG. 5 as being a representative pincount.

FIG. 6, from U.S. Pat. No. 4,723,120 to Petty, of common assignment herewith, is related to the application of a daisy chain structure in a multipoint communication structure that would otherwise require multiple ports, each connected via point-to-point interfaces to separate devices. By adopting a daisy chain structure, the controlling station can be produced with fewer ports (or channels), and each device on the channel can utilize standard upstream and downstream protocols, independent of their location in the daisy chain structure.

FIG. 7 represents a daisy chained memory bus from U.S. Pat. No. 6,317,352 to Halbert et al., implemented consistent with the teachings in U.S. Pat. No. 4,723,120. The memory controller 111 is connected to a memory bus 315, which further connects to module 310a. The information on bus 315 is re-driven by the buffer on module 310a to the next module, 310b, which further re-drives the bus 315 to module positions denoted as 310n. Each module 310a includes a DRAM 311a and a buffer 320a. The bus 315 may be described as having a daisy chain structure, with each bus being point-to-point in nature.

As storage systems evolve and become faster and denser, customers are often required to convert all of their storage devices connected to a particular subsystem to the new technology in order to take advantage of the increased speed and density.

BRIEF SUMMARY OF THE INVENTION

Exemplary embodiments of the present invention include various memory subsystem structures, each using a common multi-mode memory buffer device. The buffer device includes a packetized multi-transfer interface which is redriven to permit connection between a first memory assembly and cascaded memory assemblies. The buffer device also includes a memory interface adapted to connect to either a second memory assembly or directly to memory devices.

Further exemplary embodiments include a programmable memory address, command and data buffer device. The buffer device includes instructions to adapt the buffer device for direct attachment to a memory module to enable a buffered memory module mode of operation. The buffer device also includes selectable modes to adapt the buffer device for connection to at least one unbuffered memory module or at least one registered memory module to enable a bus converter mode of operation.

Further exemplary embodiments include a bus to bus converter device having more than one operating mode. The device includes instructions to convert a serialized packetized bus into a parallel memory bus. The device is attached to a standalone buffered memory module or the device is attached to a system board to permit attachment to an unbuffered memory module or to a registered memory module.

Additional exemplary embodiments include a method for providing a buffered memory device with multiple operating modes. The method includes receiving an input signal at the buffered memory device. The method also includes determining a mode associated with the input signal, where the mode identifies a type of memory module. The signal is transmitted to a memory assembly in a format corresponding to the mode.

Additional exemplary embodiments include a storage medium encoded with machine readable computer program code for providing a buffered memory device with multiple operating modes. The storage medium includes instructions for causing a computer to implement a method. The method includes receiving an input signal at the buffered memory device. The method also includes determining a mode associated with the input signal, where the mode identifies a type of memory module. The signal is transmitted to a memory assembly in a format corresponding to the mode.

BRIEF DESCRIPTION OF THE DRAWINGS

Referring now to the drawings wherein like elements are numbered alike in the several FIGURES:

FIG. 12 is a table that includes typical applications and operating modes of exemplary buffer devices;

DETAILED DESCRIPTION OF THE PREFERRED EMBODIMENTS

Exemplary embodiments of the present invention include a flexible, high speed and high reliability memory system architecture and interconnect structure that includes a single-ended point-to-point interconnection between any two high speed communication interfaces, The memory subsystem may be implemented in one of several structures, depending on desired attributes such as reliability, performance, density, space, cost, component re-use and other elements. The bus-to-bus converter chip, of the present invention, enables this flexibility through the inclusion of multiple, selectable memory interface modes. This maximizes the flexibility of the system designers in defining optimal solutions for each application, while minimizing product development costs and maximizing economies of scale through the use of a common device. In addition, exemplary embodiments of the present invention provide a migration path that allows a system to implement a mix of buffered memory modules and unbuffered and/or registered memory modules from a common buffer device.

Memory subsystems may utilize a buffer device to support buffered memory modules (directly connected to a memory controller via a packetized, multi-transfer interface with enhanced reliability features) and/or existing unbuffered or registered memory modules (in conjunction with the identical buffer device programmed to operate in a manner consistent with the memory interface defined for those module types). A memory subsystem may communicate with buffered memory modules at one speed and with unbuffered and registered memory modules at another speed (typically a slower speed). Many attributes associated with the buffered module structure are maintained, including the enhanced high speed bus error detection and correction features and the memory cascade function. However, overall performance may be reduced when communicating with most registered and unbuffered DIMMs due to the net topologies and loadings associated with them.

Figure 1:
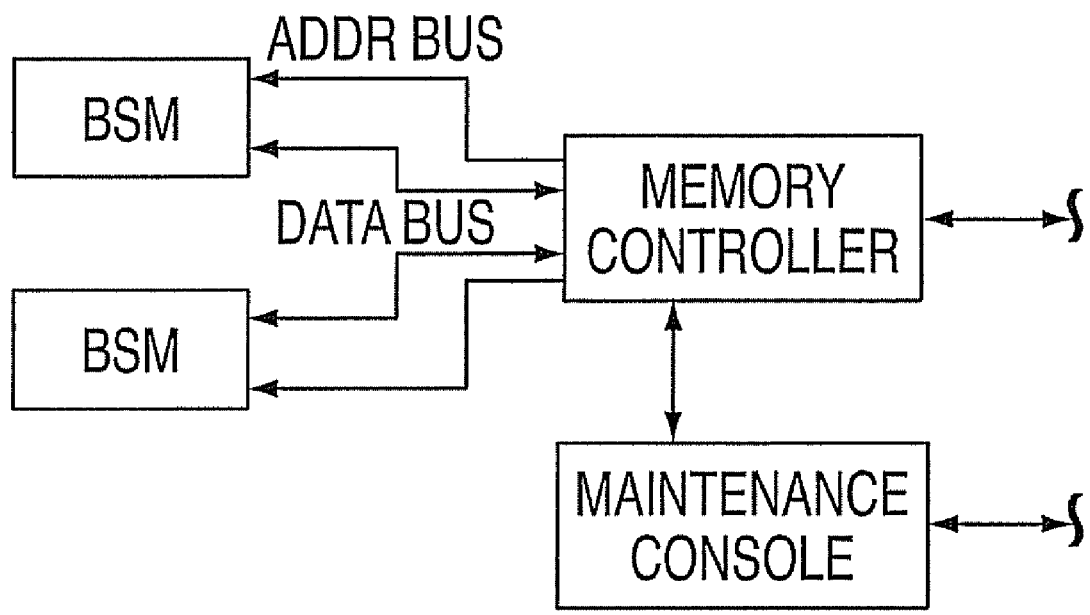
FIG. 1 depicts a prior art memory controller connected to two buffered memory assemblies via separate point-to-point links.
Figure 2:
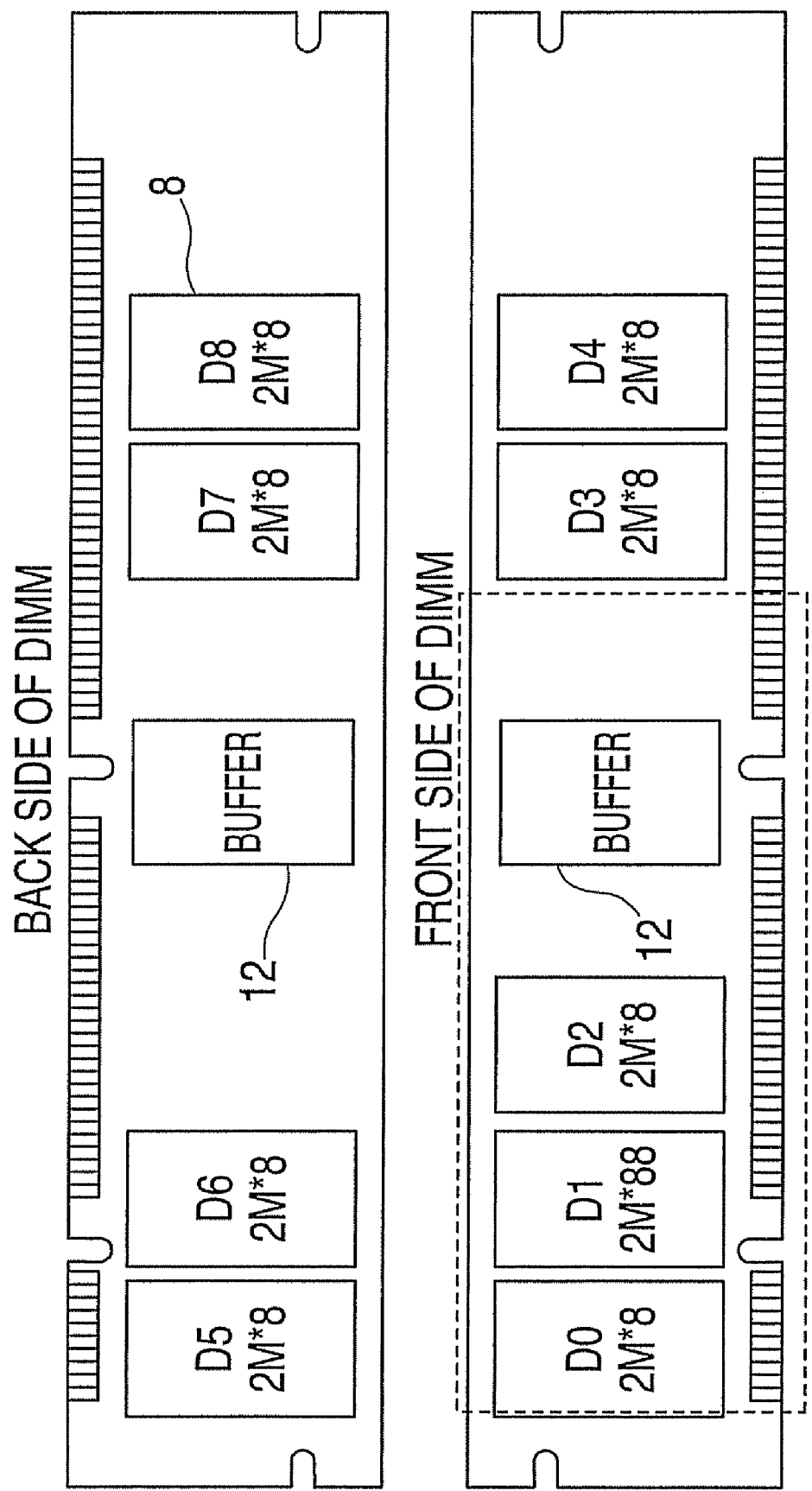
FIG. 2 depicts a prior art synchronous memory module with a buffer device.
Figure 3:
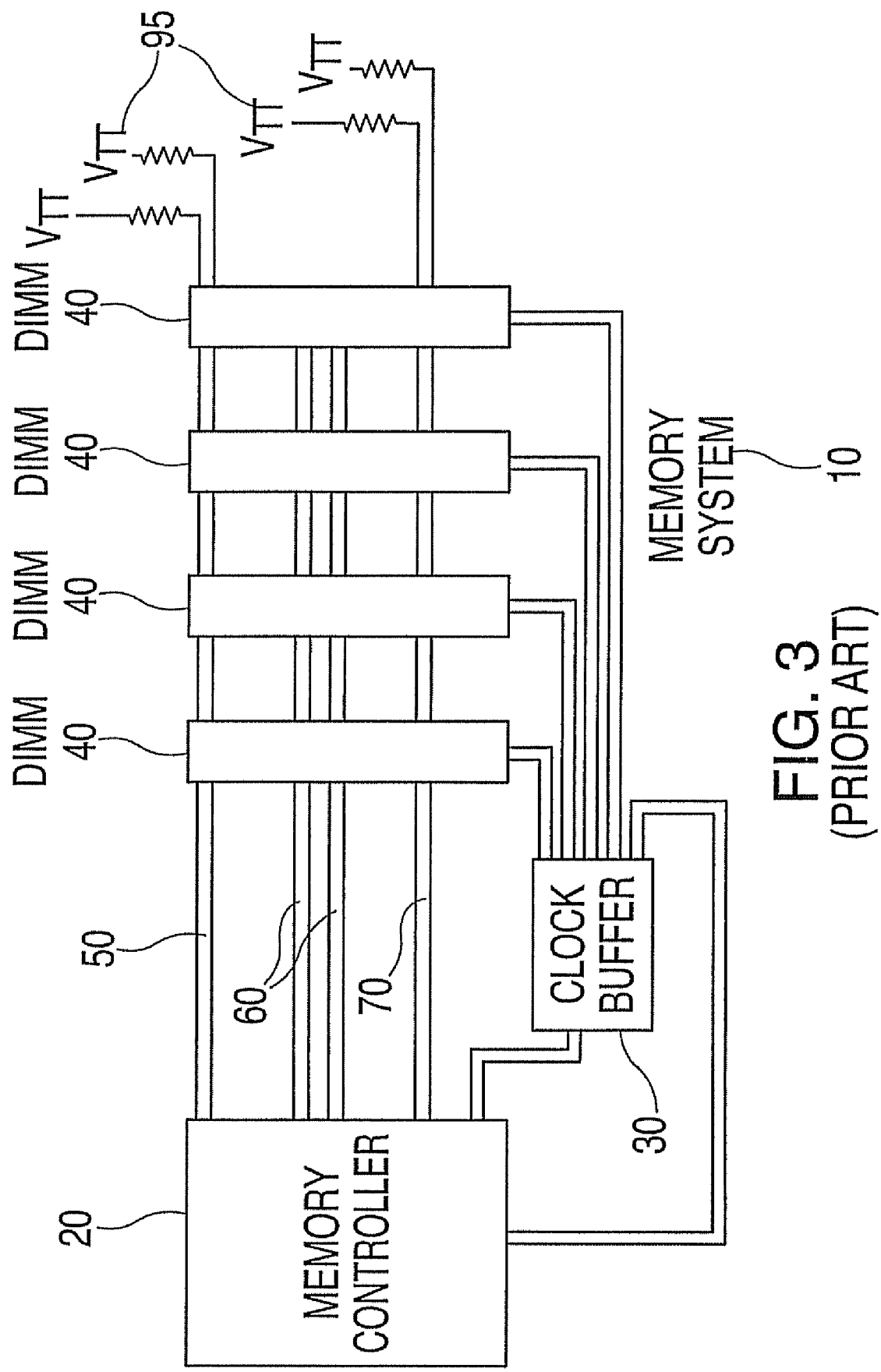
FIG. 3 depicts a prior art memory subsystem using registered DIMMs.
Figure 4:
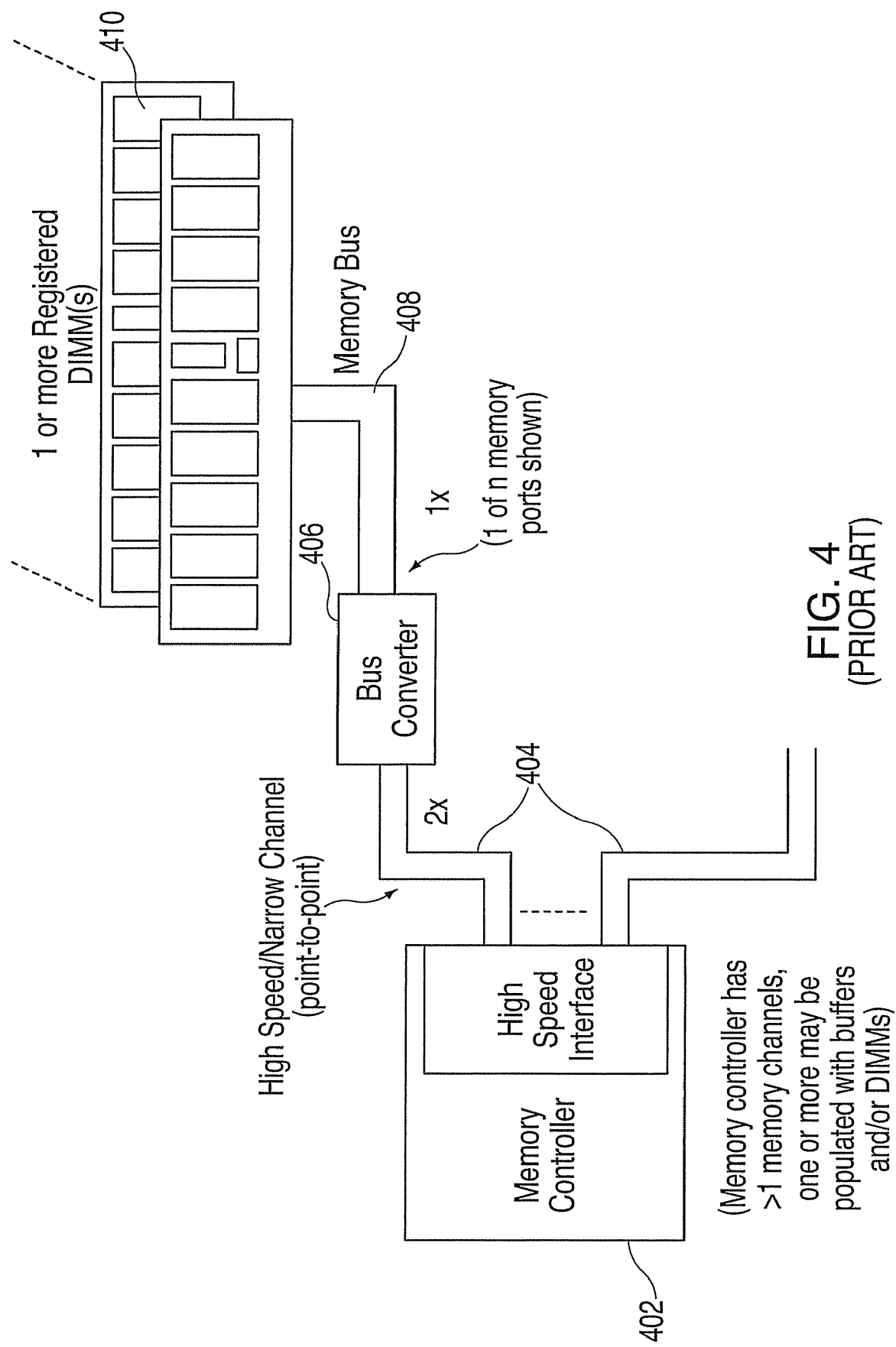
FIG. 4 depicts a prior art memory subsystem with point-to-point channels, registered DIMMs, and a 2:1 bus speed multiplier.
Figure 5:
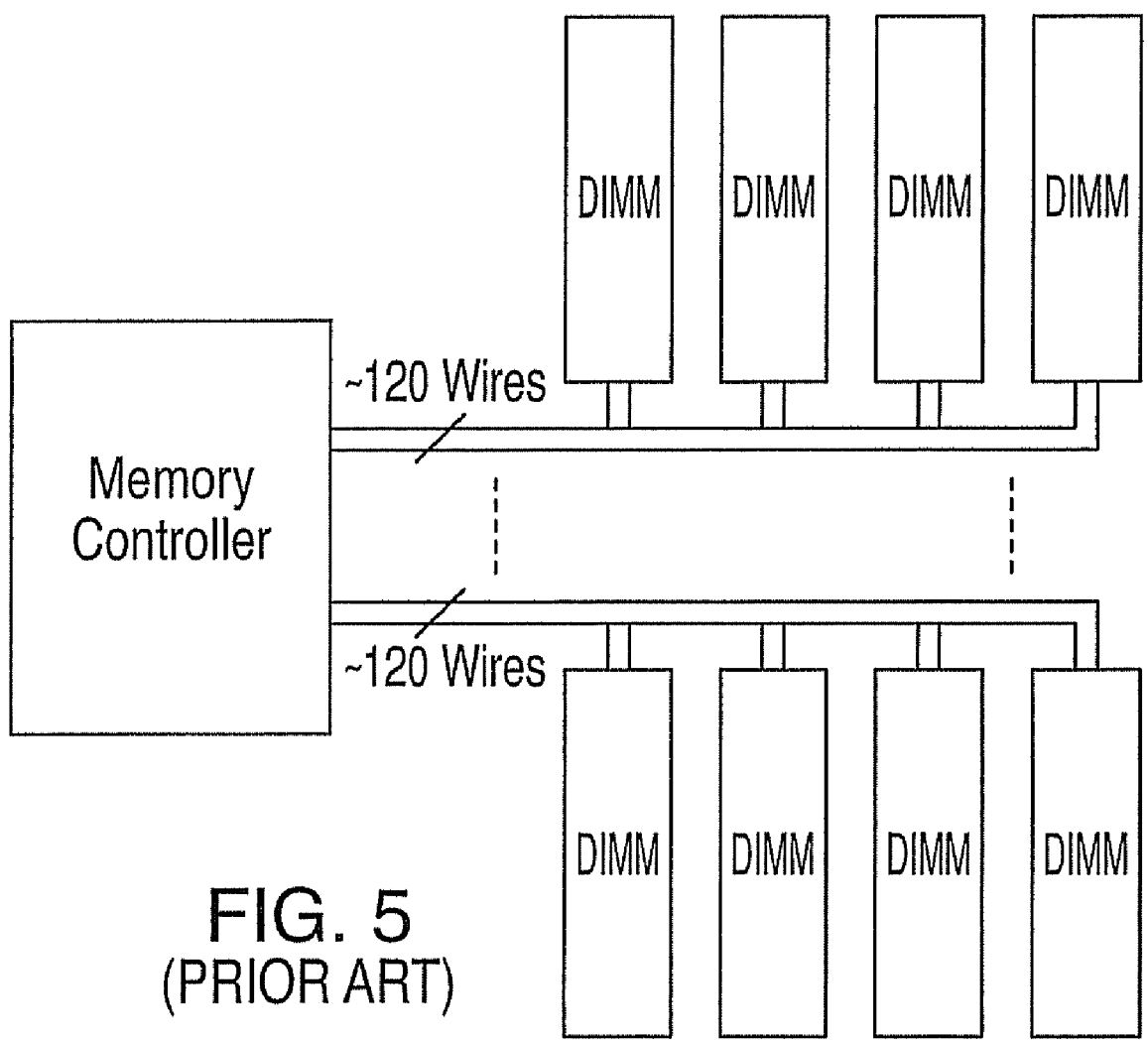
FIG. 5 depicts a prior art memory structure that utilizes a multidrop memory 'stub' bus.
Figure 6:
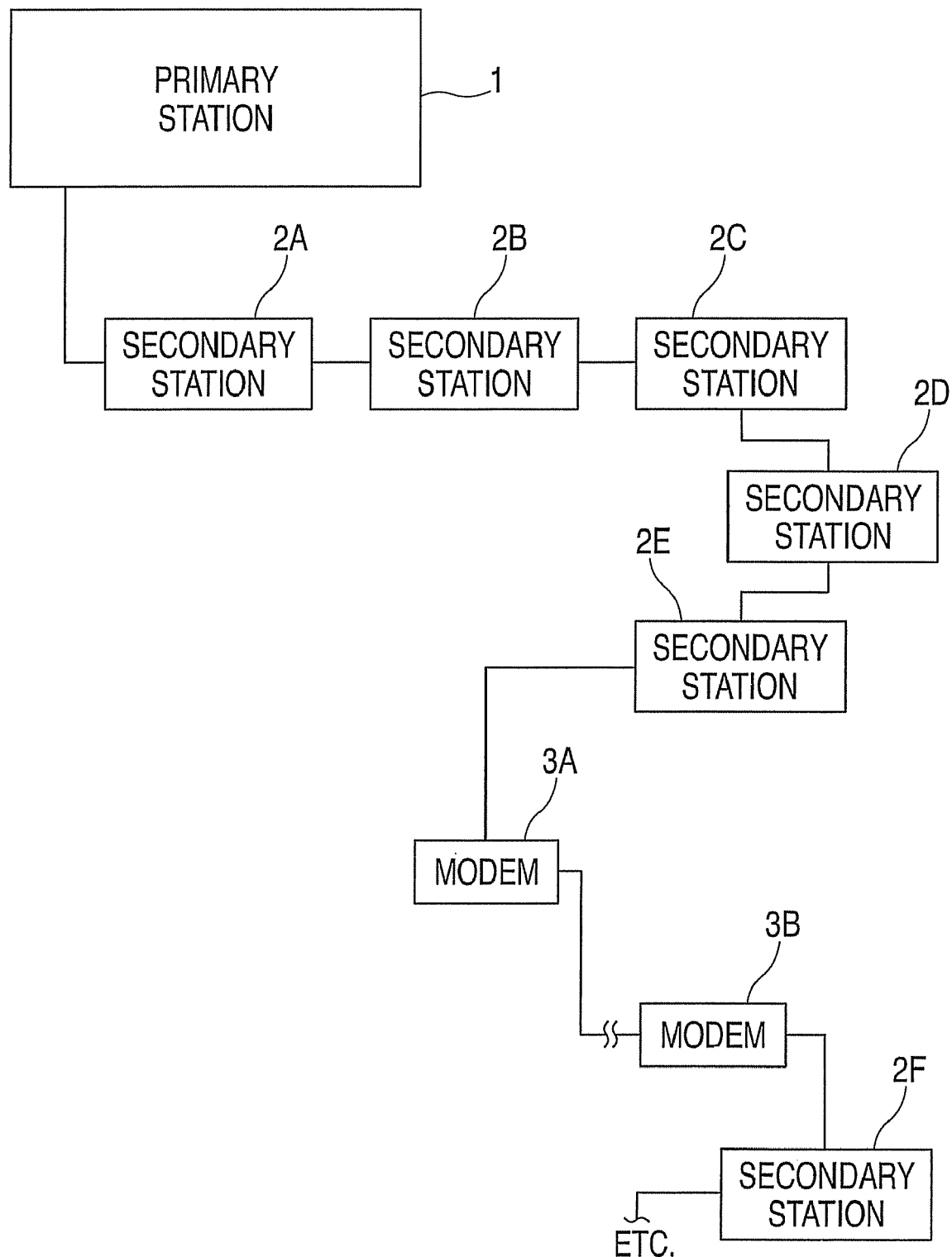
FIG. 6 depicts a prior art daisy chain structure in a multi-point communication structure that would otherwise require multiple ports.
Figure 7:
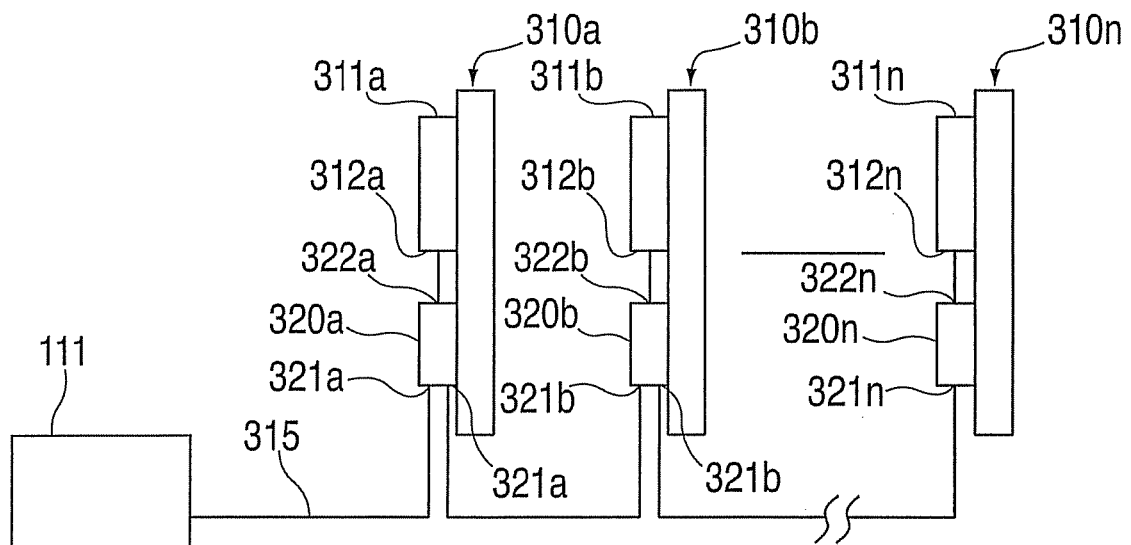
FIG. 7 depicts a prior art daisy chain connection between a memory controller and memory modules.
Figure 8:
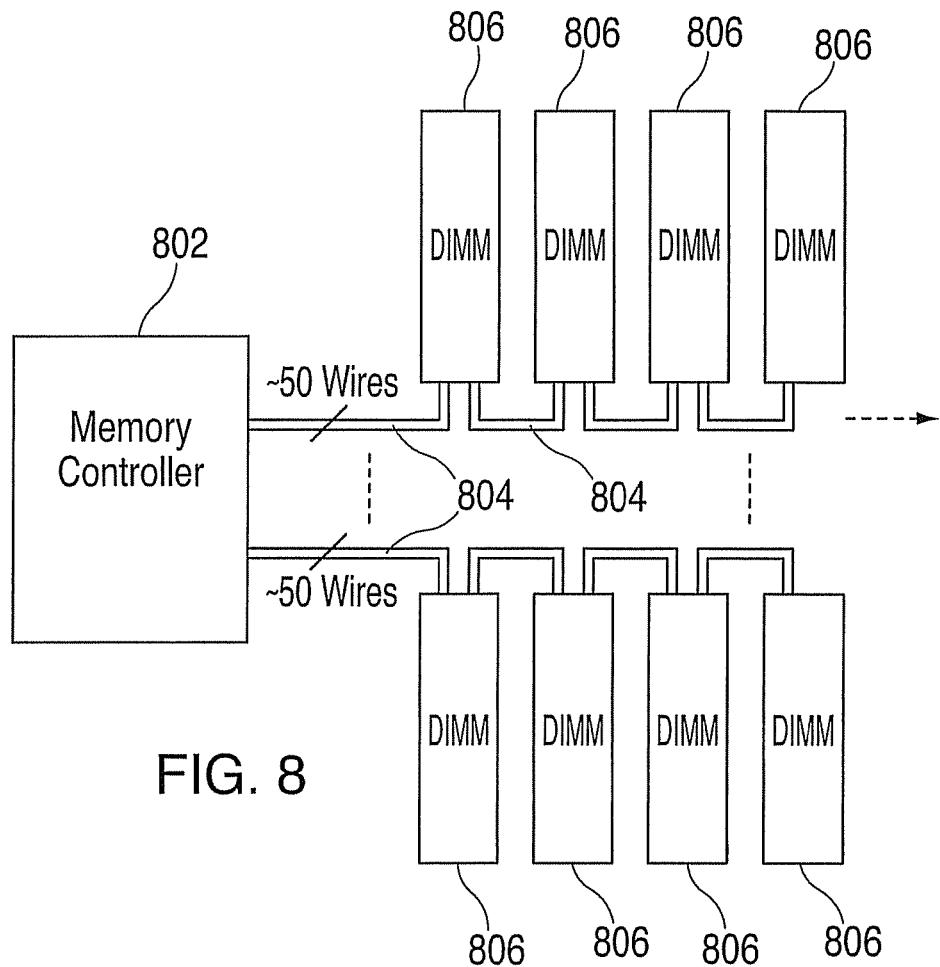
FIG. 8 depicts a cascaded memory structure that is utilized by exemplary embodiments of the present invention.

FIG. 8 depicts a cascaded memory structure that may be utilized by exemplary embodiments of the present invention when buffered memory modules 806 (e.g., the buffer device is included within the memory module 806) are in communication with the memory controller 802. This memory structure includes a memory controller 802 in communication with one or more memory modules 806 via a high speed point-to-point bus 804. Each bus 804 in the exemplary embodiment depicted in FIG. 8 includes approximately fifty high speed wires for the transfer of address, command, data and clocks. By using point-to-point busses as described in the aforementioned prior art, it is possible to optimize the bus design to permit significantly increased data rates, as well as to reduce the bus pincount by transferring data over multiple cycles. Whereas FIG. 4 depicts a memory subsystem with a two to one ratio between the data rate on any one of the busses connecting the memory controller to one of the bus converters (e.g., to 1,066 Mb/s per pin) versus any one of the busses between the bus converter and one or more memory modules (e.g., to 533 Mb/s per pin), an exemplary embodiment of the present invention, as depicted in FIG. 8, provides a four to one bus speed ratio to maximize bus efficiency and minimize pincount.

Although point-to-point interconnects permit higher data rates, overall memory subsystem efficiency must be achieved by maintaining a reasonable number of memory modules 806 and memory devices per channel (historically four memory modules with four to thirty-six chips per memory module, but as high as eight memory modules per channel and as few as one memory module per channel). Using a point-to-point bus necessitates a bus re-drive function on each memory module, to permit memory modules to be cascaded such that each memory module is interconnected to other memory modules as well as to the memory controller 802.

Figure 9:
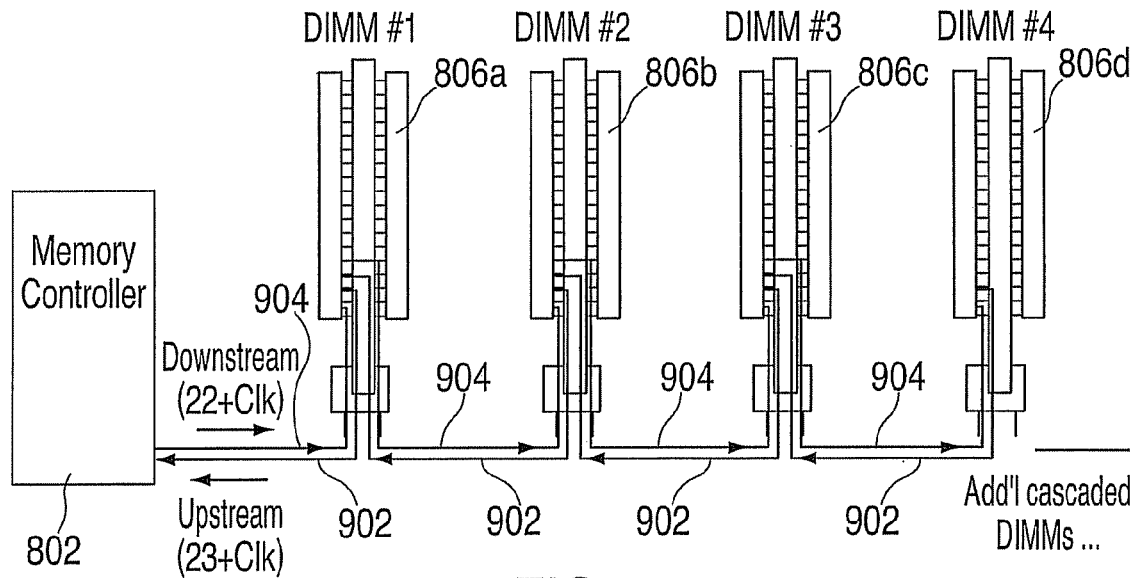
FIG. 9 depicts a memory structure with cascaded memory modules and unidirectional busses that is utilized by exemplary embodiments of the present invention.

FIG. 9 depicts a memory structure with cascaded memory modules and unidirectional busses that is utilized by exemplary embodiments of the present invention if all of the memory modules 806 are buffered memory modules 806. One of the functions provided by the memory modules 806 in the cascade structure is a redrive function to send signals on the memory bus to other memory modules 806 or to a memory controller 802. FIG. 9 includes a memory controller 802 and four memory modules 806a, 806b, 806c and 806d, on each of two memory busses (a downstream memory bus 904 and an upstream memory bus 902), connected to the memory controller 802 in either a direct or cascaded manner. Memory module 806a is connected to the memory controller 802 in a direct manner. Memory modules 806b, 806c and 806d are connected to the controller 802 in a cascaded manner.

An exemplary embodiment of the present invention includes two uni-directional busses between the memory controller 802 and memory module 806a ("DIMM #1") as well as between each successive memory module 806b-d ("DIMM #2", "DIMM #3" and "DIMM #4") in the cascaded memory structure. The downstream memory bus 904 is comprised of twenty-two single-ended signals and a differential clock pair. The downstream memory bus 904 is used to transfer address, control, data and error code correction (ECC) bits downstream from the memory controller 802, over several clock cycles, to one or more of the memory modules 806 installed on the cascaded memory channel. The upstream memory bus 902 is comprised of twenty-three single-ended signals and a differential clock pair, and is used to transfer bus-level data and ECC bits upstream from the sourcing memory module 806 to the memory controller 802. Using this memory structure, and a four to one data rate multiplier between the DRAM data rate (e.g., 400 to 800 Mb/s per pin) and the unidirectional memory bus data rate (e.g., 1.6 to 3.2 Gb/s per pin), the memory controller 802 signal pincount, per memory channel, is reduced from approximately one hundred and twenty pins to about fifty pins.

Figure 10:
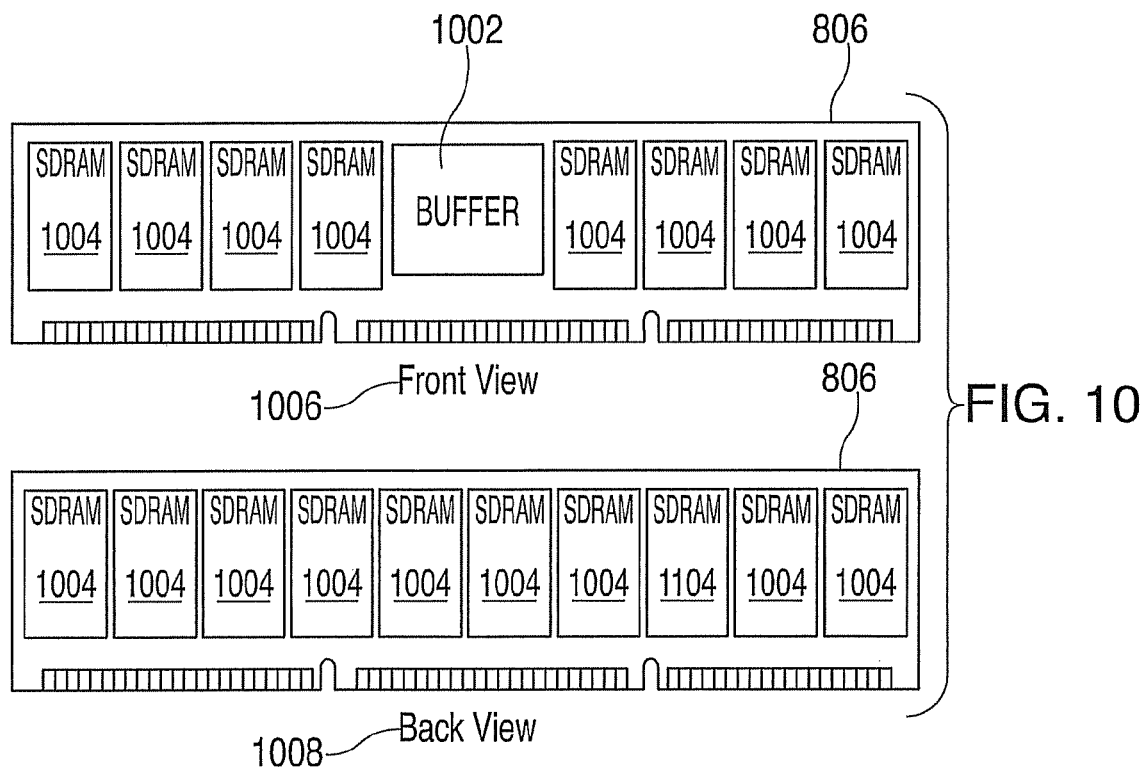
FIG. 10 depicts a buffered memory module that is utilized by exemplary embodiments of the present invention.

FIG. 10 depicts a front view 1006 and a back view 1008 of a buffered memory module 806 that is utilized by exemplary embodiments of the present invention. In exemplary embodiments of the present invention, each memory module 806 includes a blank card having dimensions of approximately six inches long by one and a half inches tall, eighteen DRAM positions, a multi-mode buffer device 1002, and numerous small components as known in the art that are not shown (e.g., capacitors, resistors, EEPROM.) In an exemplary embodiment of the present invention, the dimension of the card is 5.97 inches long by 1.2 inches tall. In an exemplary embodiment of the present invention, the multi-mode buffer device 1002 is located in the center region of the front side of the memory module 806, as depicted in the front view 1006 in FIG. 10. The synchronous DRAMS (SDRAMS) 1004 are located on either side of the multi-mode buffer device 1002, as well as on the backside of the memory module 806, as depicted in the back view 1008 in FIG. 10. The configuration may be utilized to facilitate high speed wiring to the multi-mode buffer device 1002 as well as signals from the buffer device to the SDRAMs 1004.

Figure 11:
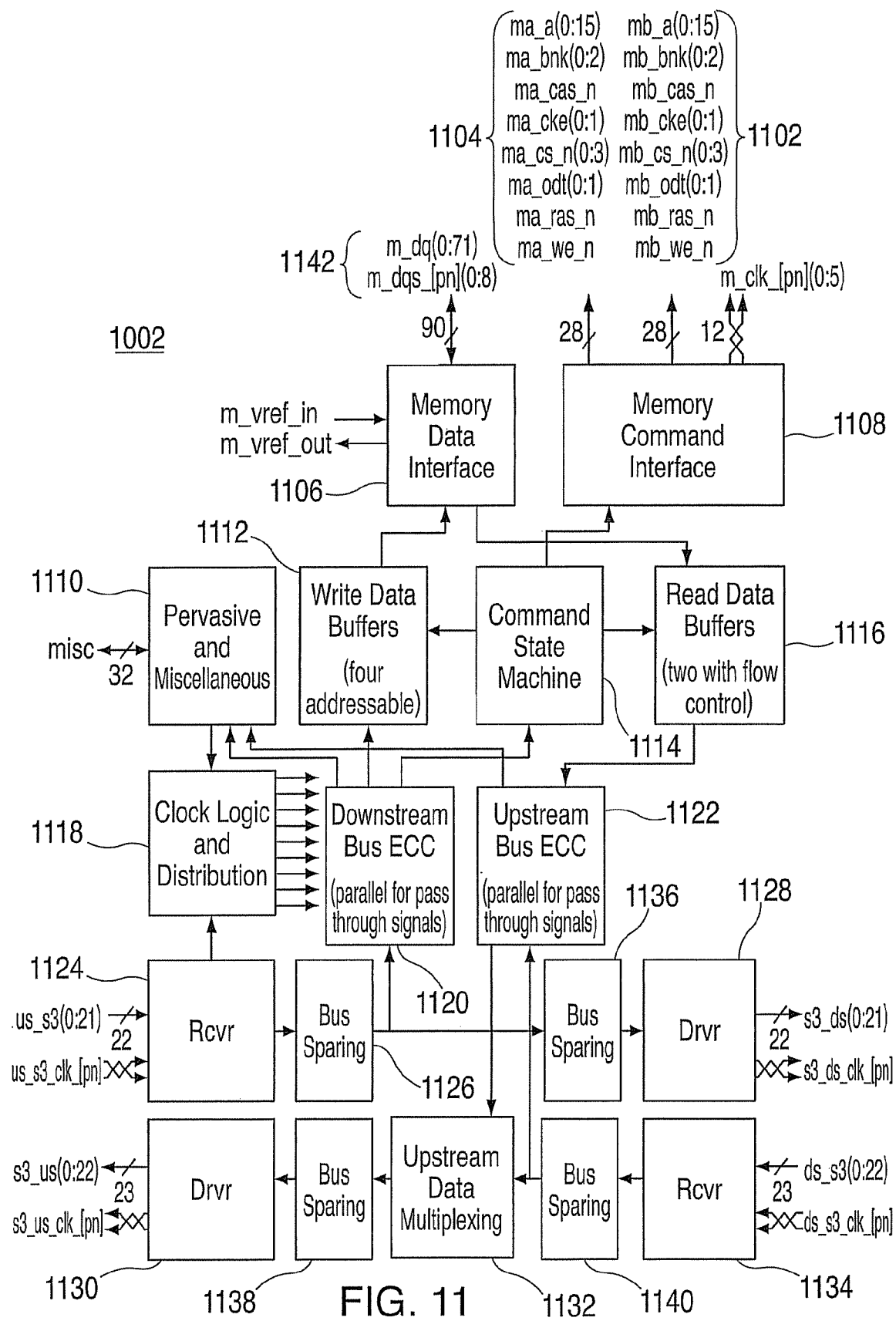
FIG. 11 is a block diagram of a multi-mode buffer device high level logic flow as utilized by exemplary embodiments of the present invention.

FIG. 11 is a block diagram of the high level logic flow of a multi-mode buffer device 1002 utilized by exemplary embodiments of the present invention. The multi-mode buffer device 1002 may be located on a memory module 806 as described previously and/or located on a system board or card to communicate with unbuffered and registered memory modules. The blocks in the lower left and right portions of the drawing (1124, 1128, 1130, 1134) are associated with receiving or driving the high speed bus 804. "Upstream" refers to the bus 902 passing information in the direction of the memory controller 802, and "downstream" refers to the bus 904 passing information away from the memory controller 802.

Referring to FIG. 11, data, command, address, ECC, and clock signals from an upstream memory assembly (i.e., a memory module 806) or a memory controller 802 are received from the downstream memory bus 904 into a receiver module 1124. The receiver functional block 1124 provides macros and support logic for the downstream memory bus 904 and, in an exemplary embodiment of the present invention includes support for a twenty-two bit, high speed, slave receiver bus. The receiver functional block 1124 transmits the clock signals to a clock logic and distribution functional block 1118 (e.g., to generate the four to one clock signals). The clock logic and distribution functional block 1118 also receives data input from the pervasive and miscellaneous signals 1110. These signals typically include control and setup information for the clock distribution PLL's, test inputs for BIST (built-in self-test) modes, programmable timing settings, etc. The receiver functional block 1124 transfers the data, command, ECC and address signals to a bus sparing logic block 1126 to reposition, when applicable, the bit placement of the data in the event that a spare wire utilized during the transmission from the previous memory assembly. In an exemplary embodiment of the present invention, the bus sparing logic block 1126 is implemented by a multiplexor to shift the signal positions, if needed. Next, the original or re-ordered signals are input to another bus sparing logic block 1136 to modify, or reorder if necessary, the signal placement to account for any defective interconnect that may exist between the current memory assembly and a downstream memory assembly. The original or re-ordered signals are then input to a driver functional block 1128 for transmission, via the downstream memory bus 904, to the next memory module 806 in the chain. In an exemplary embodiment of the present invention, the bus sparing logic 1136 is implemented using a multiplexor. The driver functional block 1128 provides macros and support logic for the downstream memory bus 904 and, in an exemplary embodiment of the present invention, includes support for the twenty-two bit, high speed, low latency cascade bus drivers.

In addition to inputting the original or re-ordered signals to the bus sparing logic 1136, the bus sparing logic 1126 also inputs the original or re-ordered signals into a downstream bus ECC functional block 1120 to perform error detection and correction for the frame. The downstream bus ECC functional block 1120 operates on any information received or passed through the multi-mode buffer device 1002 from the downstream memory bus 904 to determine if a bus error is present. The downstream bus ECC functional block 1120 analyzes the bus signals to determine if it they are valid. Next, the downstream bus ECC functional block 1120 transfers the corrected signals to a command state machine 1114. The command state machine 1114 inputs the error flags associated with command decodes or conflicts to a pervasive and miscellaneous functional block 1110. The downstream and upstream modules also present error flags and/or error data (if any) to the pervasive and miscellaneous functional block 1110 to enable reporting of these errors to the memory controller, processor, service processor or other error management unit.

Referring to FIG. 11, the pervasive and miscellaneous functional block 1110 transmits error flags and/or error data to the memory controller 802. By collecting error flags and/or error data from each memory module 806 in the chain, the memory controller 802 will be able to identify the failing segment(s), without having to initiate further diagnostics, though additional diagnostics may be completed in some embodiments of the design. In addition, once an installation selected threshold (e.g., one, two, ten, or twenty) for the number of failures or type of failures has been reached, the pervasive and miscellaneous functional block 1110, generally in response to inputs from the memory controller 802, may substitute the spare wire for the segment that is failing. In an exemplary embodiment of the present invention, error detection and correction is performed for every group of four transfers, thereby permitting operations to be decoded and initiated after half of the eight transfers, comprising a frame, are received. The error detection and correction is performed for all signals that pass through the memory module 806 from the downstream memory bus 904, regardless of whether the signals are to be processed by the particular memory module 806. The data bits from the corrected signals are input to the write data buffers 1112 by the downstream bus ECC functional block 1120.

The command state machine 1114 also determines if the corrected signals (including data, command and address signals) are directed to and should be processed by the memory module 806. If the corrected signals are directed to the memory module 806, then the command state machine 1114 determines what actions to take and may initiate DRAM action, write buffer actions, read buffer actions or a combination thereof. Depending on the type of memory module 806 (buffered, unbuffered, registered), the command state machine 1114 selects the appropriate drive characteristics, timings and timing relationships. The write data buffers 1112 transmit the data signals to a memory data interface 1106 and the command state machine 1114 transmits the associated addresses and command signals to a memory command interface 1108, consistent with the DRAM specification. The memory data interface 1106 reads from and writes memory data 1142 to a memory device. The data timing relationship to the command is different depending on the type of memory module 806. For example, when the memory data interface 1106 issues a command to a registered DIMM memory module 804, the command takes an extra clock cycle as compared to a command issued to an unbuffered DIMM memory module 806. In addition, the memory command interface 1108 outputs six differential clocks on twelve wires. To support the use of both unbuffered and registered memory modules 806, the memory a outputs 1104 and the memory b outputs 1102 from the memory command interface 1108 can be logically configured based on the type of memory module 806. For example, when the multi-mode memory device is in communication with two unbuffered DIMM memory modules 806, the memory a outputs 1104 may be directed to the first unbuffered DIMM memory module 806 and the memory b outputs 1102 may be directed to the second unbuffered DIMM memory module 806.

Data signals to be transmitted to the memory controller 802 may be temporarily stored in the read data buffers 1116 after a command, such as a read command, has been executed by the memory module 806, consistent with the memory device 'read' timings. The read data buffers 1116 transfer the read data into an upstream bus ECC functional block 1122. The upstream bus ECC functional block 1122 generates check bits for the signals in the read data buffers 1116. The check bits and signals from the read data buffers 1116 are input to the upstream data multiplexing functional block 1132. The upstream data multiplexing functional block 1132 merges the data on to the upstream memory bus 902 via the bus sparing logic 1138 and the driver functional block 1130. If needed, the bus sparing logic 1138 may re-direct the signals to account for a defective segment between the current memory module 806 and the upstream receiving module (or memory controller). The driver functional block 1130 transmits the original or re-ordered signals, via the upstream memory bus 902, to the next memory assembly (i.e., memory module 806) or memory controller 802 in the chain. In an exemplary embodiment of the present invention, the bus sparing logic 1138 is implemented using a multiplexor to shift the signals. The driver functional block 1130 provides macros and support logic for the upstream memory bus 902 and, in an exemplary embodiment of the present invention, includes support for a twenty-three bit, high speed, low latency cascade driver bus.

Data, clock and ECC signals from the upstream memory bus 902 are also received by any upstream multi-mode buffer device 1002 in any upstream memory module 806. These signals need to be passed upstream to the next memory module 806 or to the memory controller 802. Referring to FIG. 11, data, ECC and clock signals from a downstream memory assembly (i.e., a memory module 806) are received on the upstream memory bus 902 into a receiver functional block 1134. The receiver functional block 1134 provides macros and support logic for the upstream memory bus 902 and, in an exemplary embodiment of the present invention includes support for a twenty-three bit, high speed, slave receiver bus. The receiver functional block 1134 passes the data and ECC signals, through the bus sparing functional block 1140, to the upstream data multiplexing functional block 1132 and then to the bus sparing logic block 1138. The signals are transmitted to the upstream memory bus 902 via the driver functional block 1130.

In addition to passing the data and ECC signals to the upstream data multiplexing functional block 1132, the bus sparing functional block 1140 also inputs the original or re-ordered data and ECC signals to the upstream bus ECC functional block 1122 to perform error detection and correction for the frame. The upstream bus ECC functional block 1122 operates on any information received or passed through the multi-mode buffer device 1002 from the upstream memory bus 902 to determine if a bus error is present. The upstream bus ECC functional block 1122 analyzes the data and ECC signals to determine if they are valid. Next, the upstream bus ECC functional block 1122 transfers any error flags and/or error data to the pervasive and miscellaneous functional block 1110 for transmission to the memory controller 802. In addition, once a pre-defined threshold for the number or type of failures has been reached, the pervasive and miscellaneous functional block 1110, generally in response to direction of the memory controller 802, may substitute the spare segment for a failing segment.

The block diagram in FIG. 11 is one implementation of a multi-mode buffer device 1002 that may be utilized by exemplary embodiments of the present invention. Other implementations are possible without departing from the scope of the present invention.

FIG. 12 is a table that includes typical applications and operating modes of exemplary buffer devices. Three types of buffer modes 1208 are described: buffered DIMM 1202; registered DIMM 1204; and unbuffered DIMM 1206. The "a" and "b" bus that are output from the memory command interface 1108 can be logically configured to operate in one or more of these modes depending on the application. The table includes: a ranks column 1210 that contains the number of ranks per DIMM; a chip select (CS) column that contains the number of buffer CS outputs used, in addition to the loads per CS; a clock column 1214 that contains the number of buffer clock pairs used and the loads per clock pair; and a miscellaneous column 1216 that includes wiring topology information. A load refers to a receiver input to a DRAM, register, buffer, PLL or appropriate device on the memory module 806.

As indicated in FIG. 12, the buffered DIMM implementation supports up to nine memory devices per rank, with each device having an eight bit interface (seventy-two bits total). If all eight ranks are populated on a given module constructed of current one gigabit devices, the total memory density of the module will be eight gigabytes. As evident by the table entries under the CS column 1212 (the CS is generally utilized on DIMMs as a rank select to activate all the memory devices in the rank) and the clock column 1214, the varying loads and net structures require different driver characteristics (e.g., drive strength) for the multi-mode buffer device 1002. In addition, as the registered DIMMs generally add a single clock delay on all inputs that pass through the register on the DIMM (address and command inputs), the multi-mode buffer device 1002 needs to accommodate the extra clock of latency by ensuring accurate address and command-to-data timings. Further, the unbuffered DIMMs, as well as the heavily loaded buffered DIMM applications often require two-transition (2T) addressing, due to heavy loading on address and certain command lines (such as row address strobe (RAS), column address strobe (CAS) and write enable (WE)). In the latter case, the buffer operates such that these outputs are allowed two clock cycles to achieve and maintain a valid level prior to the CS pin being driven low to capture these DRAM inputs and initiate a new action.

The terms "net topology" in FIG. 12 refer to a drawing and/or textual description of a wiring interconnect structure between two or more devices. A "fly-by-topology" is a wiring interconnect structure in which the source (driver) is connected to two or more devices that are connected along the length of a wire, that is generally terminated at the far end, where the devices along the wire receive the signal from the source at a time that is based on the flight time through the wire and the distance from the source. A "T" net topology is a wiring interconnect structure that includes a source (driver) that is connected to two or more devices through a wire that branches or splits. Each branch or split is intended to contain similar wire length and loading. In general, a single wire will split into two branches from a single branch point, with each branch containing similar line length and loading. Inputs wired to a single register or clock are generally considered to be point-to-point. Inputs wired to multiple registers or PLLs are generally wired in a "T" net structure so that each receiver receives the input at approximately the same time, with a similar waveform. The "T" nets defined above are typically not end-terminated, but generally include a series resistor termination in the wire segment prior to the branch point.

Figure 13:
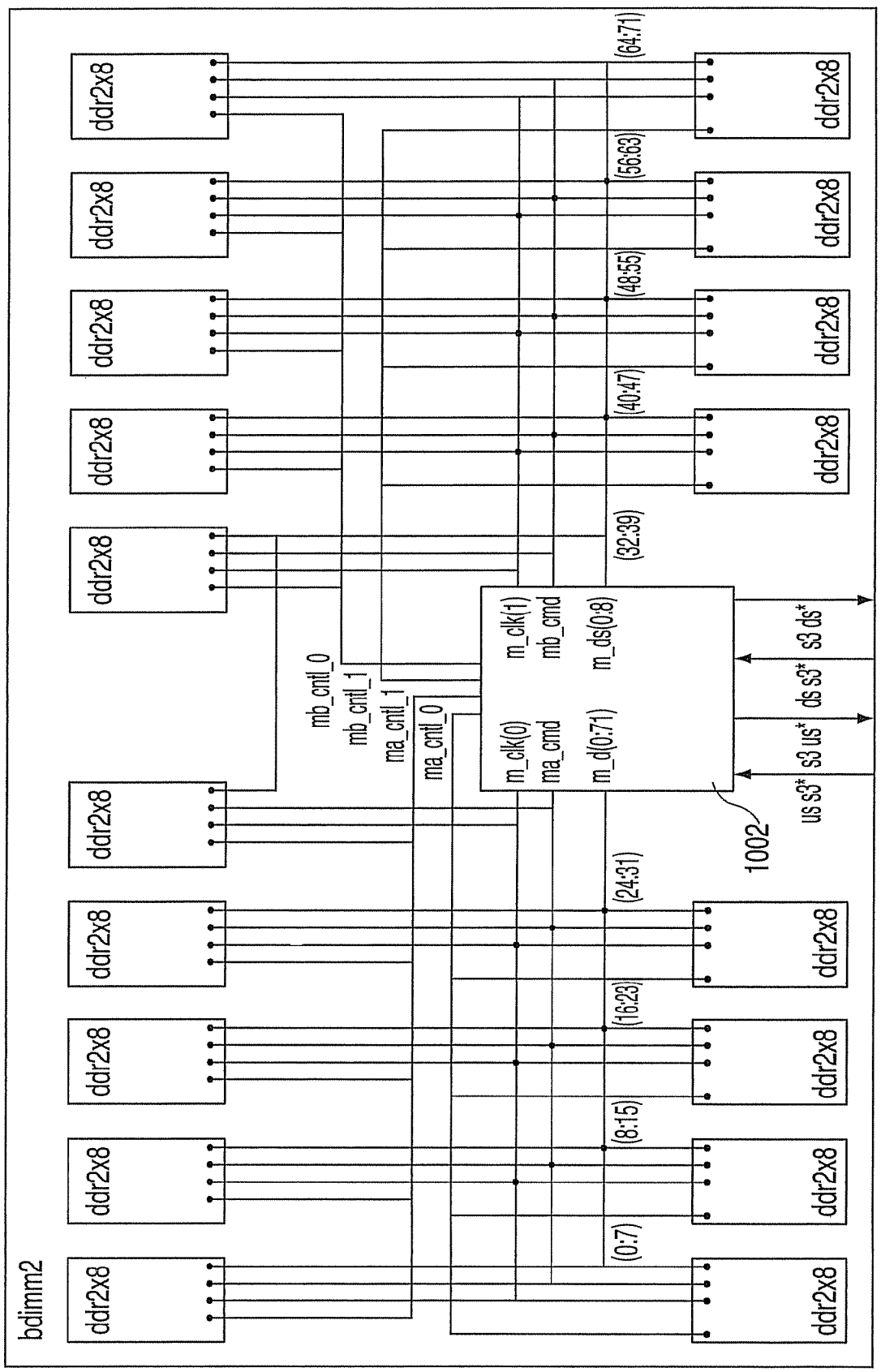
FIG. 13 is a simplified block diagram of a buffered DIMM produced with a multi-mode buffer device that may be utilized by exemplary embodiments of the present invention.

FIG. 13 is a simplified block diagram of a buffered DIMM memory module with the multi-mode buffer device 1002 that may be utilized by exemplary embodiments of the present invention. It provides an example of the net structures and loading associated with a two rank buffered DIMM produced with eighteen, DDR2 eight bit memory devices, consistent with the information in the table in FIG. 12. The CS and clock signals are wired in a fly-by structure, the lines shown in the drawing from the mainline wire to each memory device appear to be long only to simplify the drawing. The fly-by net end-termination is not shown, but is included in the exemplary embodiment.

Figure 14:
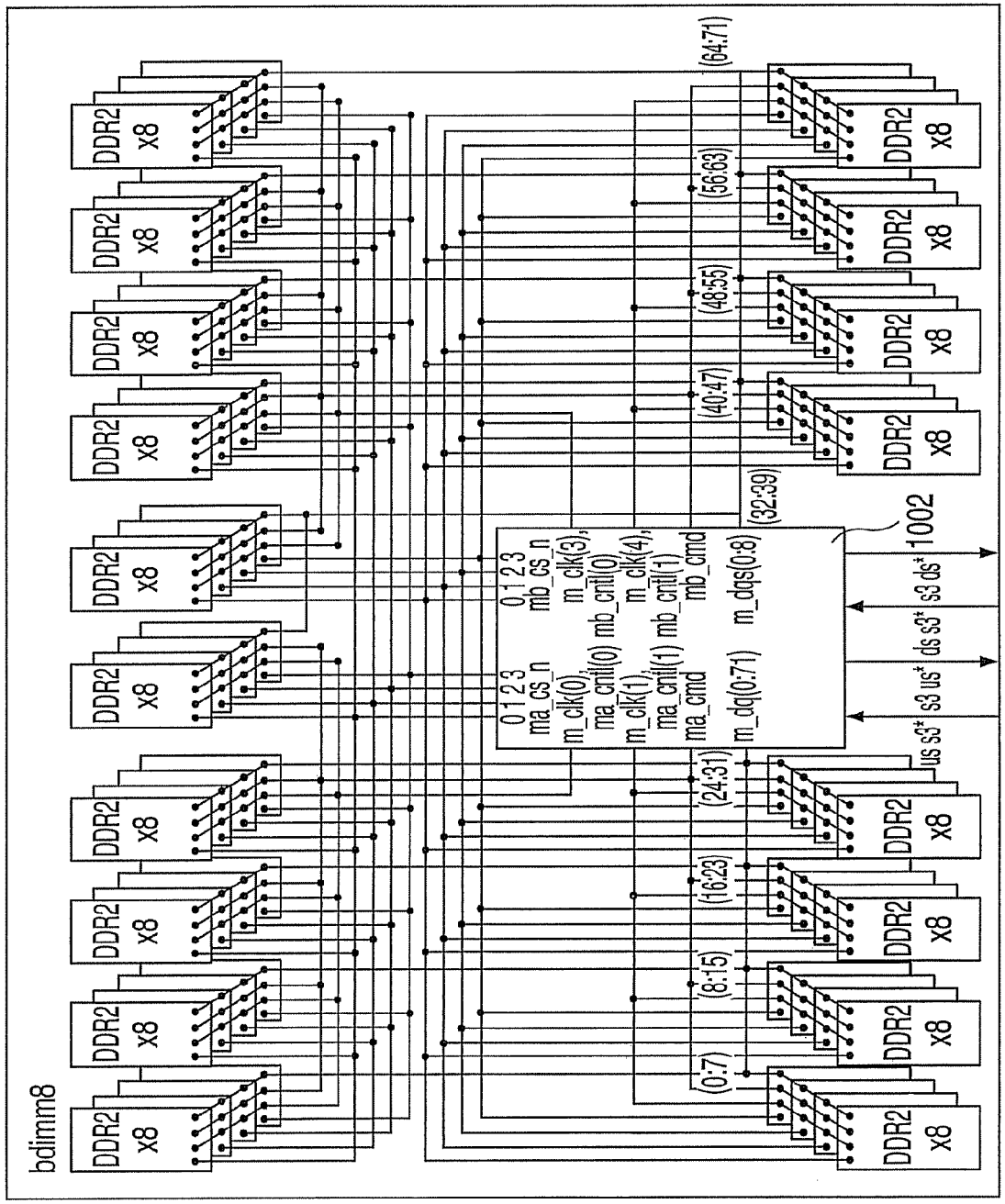
FIG. 14 is a simplified block diagram of a buffered DIMM produced with a multi-mode buffer device that may be utilized by exemplary embodiments of the present invention.

FIG. 14 is a simplified block diagram of a buffered DIMM memory module 806 produced with a multi-mode buffer device 1002 that may be utilized by exemplary embodiments of the present invention. It provides an example of the net structures and loading associated with an eight rank buffered DIMM memory module 806 produced with eight bit memory devices, consistent with the information in the table in FIG. 12. Each CS output controls nine memory devices (seventy-two bits) in this example, whereas each CS controls four or five (thirty-two to forty bits) in FIG. 13.

Figure 15:
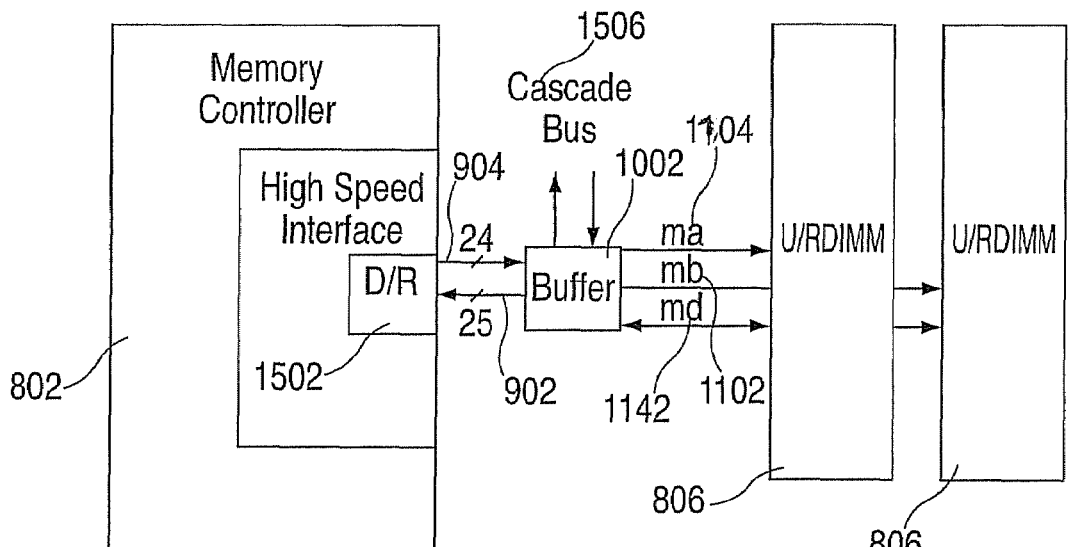
FIG. 15 is a block diagram of a board-mounted buffer device that may be utilized by exemplary embodiments of the present invention.

FIG. 15 is a block diagram of a board-mounted multi-mode buffer device 1002 that may be utilized by exemplary embodiments of the present invention. FIG. 15 demonstrates the use of the multi-mode buffer device 1002 (the same one discussed previously with regard to buffered memory modules 806) as a board-mounted bus-to-bus converter chip, attached to one or two unbuffered or registered DIMM memory modules 806. The multi-mode buffer device 1002 includes a selection means to adapt the buffer device 1002 for direct attachment to a memory module 806 to enable a buffered memory module mode of operation or to adapt the buffer device 1002 for connection to at least one of an unbuffered memory module and a registered memory module to enable a bus converter mode of operation. The selection means may be implemented in hardware and/or software. In addition a cascade bus 1506 is available from the buffer (or exists on the buffer) and can be connected to a buffered DIMM memory module 806 or via another multi-mode buffer device 1002, to sockets intended for either a second one or two unbuffered or registered DIMM memory modules 806. In this example, the memory a outputs 1104 are connected to the first DIMM position and the memory b outputs 1102 are connected to the second DIMM position, and one or both DIMM positions may be populated based on the application requirements. In addition, the memory data 1142 is connected to both memory modules 806 in FIG. 15, generally as a conventional multi-drop net. An upstream receiver functional block 1124 and a downstream driver functional block 1128 are contained in the driver/receiver functional block 1502 within the memory controller 802. An upstream receiver functional block 1124, an upstream driver functional block 1130, a downstream driver functional block 1128 and a downstream receiver functional block 1134 are included in the multi-mode buffer device 1002 as depicted in FIG. 11. The upstream memory bus 902 and the downstream memory bus 904 are utilized to transfer data, commands, address and clock data between the memory controller 802 and the multi-mode buffer device 1002.

Figure 16:
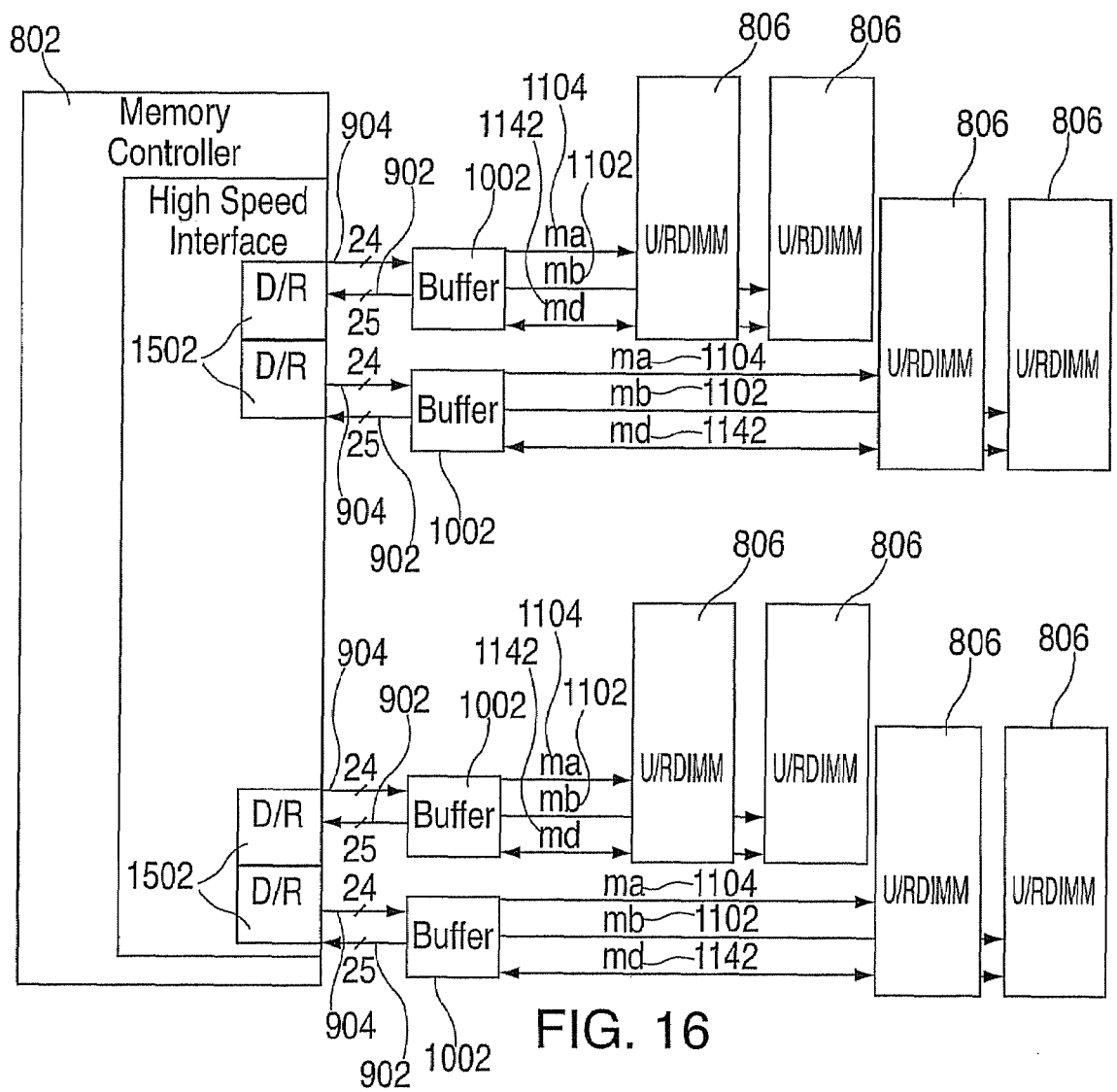
FIG. 16 is a block diagram of a board-mounted buffer device that may be utilized by exemplary embodiments of the present invention.

FIG. 16 is a block diagram of a board-mounted buffer device that may be utilized by exemplary embodiments of the present invention. FIG. 16 depicts the use of the multi-mode buffer device 1002 (the same one discussed previously with regard to buffered memory modules 806) as a board-mounted bus-to-bus converter chip with four memory busses connected from a memory controller to four bus-to-bus converter chips, or buffer devices 1002. Each of the buffer devices 1002 is further shown to connect to up to two unbuffered memory modules 806 or up to two registered DIMM memory modules 806, although it is possible to operate the system with as few as one to two total memory modules 806 attached to one or two of the high speed memory busses. This structure also permits a cascade port from each multi-mode buffer device 1002 to another buffer device or to a buffered memory module 806 although this connection is not shown for simplicity. As with FIG. 15, the memory a outputs 1104 are connected to the first DIMM memory module 806 position and the memory b outputs 1102 are connected to the second DIMM memory module 806 position. The memory data 1142 is connected to both DIMM memory modules 806, generally as a conventional multi-drop net.

The memory configurations depicted in FIGS. 15 and 16 are exemplary in nature and other memory configurations including unbuffered memory modules 806, registered memory modules 806 and buffered memory modules 806 are possible when utilizing the multi-mode buffer device 1002 described herein.

Exemplary embodiments of the present invention provide a multi-mode buffer device 1002 that may be implemented in one of several structures, depending on desired attributes such as reliability, performance, density, space, cost, component re-use and other elements. A bus-to-bus converter module/chip provides this flexibility through the inclusion of multiple, selectable memory interface modes. This may be utilized to maximize the flexibility of the system designers in defining optimal solutions for each installation, while minimizing product development costs and maximizing economies of scale through the use of a common device. In addition, exemplary embodiments of the present invention may be utilized to provide a migration path that allows an installation to implement a mix of buffered memory modules and unbuffered and/or registered memory modules from a common buffer device.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A buffer device for providing multiple operating modes, the buffer device comprising:
   a first memory interface adapted to connect the buffer device to a cascaded interconnect system through an upstream memory bus and a downstream memory bus, wherein the buffer device receives one or more clock inputs; and
   a second memory interface which includes one or more second clock lines for driving one or more second clocks derived from the one or more clock inputs, the second memory interface having two or more selectable modes of operation including:
      a first mode of operation for connecting the buffer device to one or more synchronous memory devices located on a first memory assembly which includes the buffer device; and
      a second mode of operation for connecting the buffer device to one or more second memory assemblies, the second memory assemblies including one or more of unbuffered and registered memory assemblies, wherein at least one of the second memory assemblies requires that the buffer device communicate with the second memory assembly using drive strength and timing characteristics that differ from those used to communicate with the synchronous memory devices connected to the first memory assembly in the first mode of operation, the timing characteristics including one or more of read data, write data, address and command timing relationships relative to the one or more second clocks.

2. The buffer device of claim 1 wherein one of the second memory assemblies is an unbuffered memory assembly.

3. The buffer device of claim 2 wherein the timing characteristics further include read or write data relative to one of the second clocks.

4. The buffer device of claim 1 wherein one of the second memory assemblies is a registered memory assembly.

5. The buffer device of claim 4 wherein in the second mode of operation there is a reduced drive strength for the addresses relative to the first mode of operation.

6. The buffer device of claim 1 wherein the buffer device is operable with two or more registered memory assemblies or two or more unbuffered memory assemblies.

7. The buffer device of claim 1 wherein one of the second clocks is redriven on the registered memory assemblies.

8. The buffer device of claim 7 wherein the registered memory assembly provides a maximum of two loads per second clock.

9. The buffer device of claim 1 wherein the buffer device communicates with memory devices that are interconnected to each other using different wiring topologies.

10. The buffer device of claim 1 wherein in the second mode of operation, data arrives at the buffer device at least one clock later in relationship to a command than in the first mode of operation.

11. A buffer device for providing multiple operating modes, the buffer device comprising:
    a first memory interface adapted to connect the buffer device to a cascaded interconnect system through an upstream memory bus and a downstream memory bus, wherein the buffer device receives one or more clock inputs; and
    a second memory interface which includes one or more second clock lines for driving one or more second clocks derived from the one or more clock inputs, the second memory interface having two or more selectable modes of operation including:

a first mode of operation for connecting the buffer device to one or more synchronous memory devices located on a first memory assembly which includes the buffer device; and a second mode of operation for connecting the buffer device to one or more second memory assemblies, the second memory assemblies including one or more of unbuffered and registered memory assemblies, wherein at least one of the second memory assemblies requires that the buffer device communicate with the second memory assembly using one or both of drive strength and timing characteristics that differ from those used to communicate with the synchronous memory devices connected to the first memory assembly in the first mode of operation, the timing characteristics including one or more of read data, write data, address and command timing relationships relative to the one or more second clocks.

12. The buffer device of claim 11 wherein one of the second memory assemblies is an unbuffered memory assembly.

13. The buffer device of claim 12 wherein the timing characteristics further include read or write data relative to one of the second clocks.

14. The buffer device of claim 11 wherein one of the second memory assemblies is a registered memory assembly.

15. The buffer device of claim 14 wherein in the second mode of operation there is a reduced drive strength for the addresses relative to the first mode of operation.

16. The buffer device of claim 11 wherein the buffer device is operable with two or more registered memory assemblies or two or more unbuffered memory assemblies.

17. The buffer device of claim 11 wherein one of the second clocks is redriven on the registered memory assemblies.

18. The buffer device of claim 17 wherein the registered memory assembly provides a maximum of two loads per second clock.

19. The buffer device of claim 11 wherein the buffer device communicates with memory devices that are interconnected to each other using different wiring topologies.

20. The buffer device of claim 11 wherein in the second mode of operation, data arrives at the buffer device at least one clock later in relationship to a command than in the first mode of operation.

* * * * *